(12) United States Patent
Schloss et al.

(10) Patent No.: US 8,031,510 B2
(45) Date of Patent: *Oct. 4, 2011

(54) ION BARRIER CAP

(75) Inventors: Lawrence Schloss, Palo Alto, CA (US); Rene Meyer, Mountain View, CA (US); Wayne Kinney, Emmett, ID (US); Roy Lambertson, Los Altos, CA (US); Julie Casperson Brewer, Santa Clara, CA (US)

(73) Assignee: Unity Semiconductor Corporation

( * ) Notice: Subject to any disclaimer, the term of this patent is extended or adjusted under 35 U.S.C. 154(b) by 0 days.

This patent is subject to a terminal disclaimer.

(21) Appl. No.: 12/803,810

(22) Filed: Jul. 6, 2010

(65) Prior Publication Data

US 2011/0149636 A1 Jun. 23, 2011

Related U.S. Application Data

(63) Continuation of application No. 12/653,838, filed on Dec. 18, 2009.

(51) Int. Cl.
*G11C 11/00* (2006.01)

(52) U.S. Cl. ........................................ 365/148

(58) Field of Classification Search .................. 365/148, 365/163

See application file for complete search history.

(56) References Cited

U.S. PATENT DOCUMENTS

| | | | |
|---|---|---|---|
| 6,034,882 A | 3/2000 | Johnson et al. |
| 6,518,156 B1 | 2/2003 | Chen et al. |
| 6,849,891 B1 | 2/2005 | Hsu et al. |
| 6,903,361 B2 | 6/2005 | Gilton |
| 6,930,909 B2 | 8/2005 | Moore et al. |
| 6,940,113 B2 | 9/2005 | Hsu et al. |
| 6,965,137 B2 | 11/2005 | Kinney et al. |
| 6,972,238 B2 | 12/2005 | Hsu et al. |
| 7,060,586 B2 | 6/2006 | Li et al. |
| 7,067,862 B2 | 6/2006 | Rinerson et al. |
| 7,148,533 B2 | 12/2006 | Hsu et al. |
| 7,218,984 B1 | 5/2007 | Bayat et al. |
| 7,256,429 B2 | 8/2007 | Hsu et al. |
| 7,417,271 B2 | 8/2008 | Genrikh et al. |
| 7,446,010 B2 | 11/2008 | Li et al. |
| 7,459,716 B2 | 12/2008 | Toda et al. |
| 7,460,385 B2 | 12/2008 | Gruber et al. |
| 7,462,857 B2 | 12/2008 | Arai et al. |
| 7,558,099 B2 | 7/2009 | Morimoto |
| 7,569,459 B2 | 8/2009 | Karg et al. |
| 7,577,022 B2 | 8/2009 | Muraoka et al. |

(Continued)

OTHER PUBLICATIONS

U.S. Appl. No. 12/454,322, May 15, 2009, Rinerson et al. U.S. Appl. No. 12/653,851, Dec. 18, 2009, Rinerson et al.
U.S. Appl. No. 12/653,836, Dec. 18, 2009, Schloss et al.
U.S. Appl. No. 12/653,854, Dec. 18, 2009, Bornstein.
U.S. Appl. No. 12/653,835, Dec. 18, 2009, Meyer.
U.S. Appl. No. 11/095,026, Mar. 30, 2005, Rinerson et al.

*Primary Examiner* — Michael Tran

(57) ABSTRACT

An ion barrier layer made from a dielectric material in contact with an electronically insulating layer is operative to prevent mobile ions transported into the electronically insulating layer from passing through the ion barrier layer and into adjacent layers during data operations on a non-volatile memory cell. A conductive oxide layer in contact with the electronically insulating layer is the source of the mobile ions. A programming data operation is operative to transport a portion of the mobile ions into the electronically insulating layer and an erase data operation is operative to transport the mobile ions back into the conductive oxide layer. When the portion is positioned in the electronically insulating layer the memory cell stores data as a programmed conductivity profile and when a substantial majority of the mobile ions are positioned in the conductive oxide layer the memory cell stores data as an erased conductivity profile.

17 Claims, 19 Drawing Sheets

U.S. PATENT DOCUMENTS

| | | |
|---|---|---|
| 7,606,086 B2 | 10/2009 | Inoue |
| 7,633,108 B2 | 12/2009 | Li et al. |
| 7,884,349 B2 | 2/2011 | Rinerson et al. |
| 2003/0151959 A1 | 8/2003 | Tringali et al. |
| 2007/0069217 A1* | 3/2007 | Herner .......................... 257/77 |
| 2007/0105390 A1 | 5/2007 | Oh |
| 2007/0176264 A1 | 8/2007 | Lee et al. |
| 2008/0173975 A1 | 7/2008 | Chen et al. |
| 2009/0026441 A1 | 1/2009 | Cheung et al. |
| 2009/0026442 A1 | 1/2009 | Cheung et al. |
| 2009/0027976 A1 | 1/2009 | Brewer et al. |
| 2009/0225582 A1 | 9/2009 | Schloss |

* cited by examiner

ION BARRIER CAP

FIELD OF THE INVENTION

The present invention relates generally to semiconductors and memory technology. More specifically, present invention relates to a non-volatile memory device including an ion barrier.

BACKGROUND

Conventional memory devices made using semiconductor materials are typically fabricated using various types of material, such as silicon dioxide ($SiO_2$), noble metals, just to name a few. Conventional fabrication techniques for semiconductor-type memories typically use deposition of thin film materials on substrates (e.g., silicon wafers), which are subsequently etched away using different types of etching procedures and etching materials. Conventional memory devices are fabricated to withstand the forward and reverse biasing of voltages in order to write data (e.g., a program operation or an erase operation) for a given estimated lifespan. Conventional techniques are problematic because typical memory devices can fail or breakdown due to the repeated application of voltages for data operations such as read and write operations. In some conventional memory technologies, memory cells that are electrically coupled with the word line and/or bit line of a memory cell that is selected for a data operation are referred to as half-selected memory cells and those memory cells can be subject to data disturbs caused by voltage potentials on their word or bit lines. Over time, data disturbs can corrupt the value of data stored in a memory cell and subsequent read operations on memory cells that have suffered to many disturbs can result in values of data that cannot be accurately determined by read circuitry, such as sense amps, for example.

In some conventional memory devices, the ability to accurately write data to a memory device is often limited by the materials, fabrication techniques, and/or structures used for the memory devices. Some conventional materials, fabrication techniques, and structures are problematic because a high resistive memory effect is not achieved by the use of those materials, fabrication techniques, and structures. A high resistive memory effect is desirable in order to determine the state of data stored in a given memory device (e.g., a programmed state or an erased state). For example, if a programmed state is a high resistance state that generates a low magnitude of read current during a read operation and an erased state is a low resistance state that generates a higher magnitude of read current during the read operation, then a high resistive memory effect results in a significant difference between the resistance of the programmed state and the erased state and a significant difference in the magnitude of read currents from erased or programmed memory devices. A ratio of 100:1 or more between the resistances of the programmed state and the erased state can result in a high signal-to-noise ratio S/N during read operations. A high S/N can be beneficial to sense amp circuitry used for generating data values (e.g., logic "0" for programmed devices and logic "1" for erased devices) based on the magnitude of the read currents. Typically, during a read operation on an array of memory devices, there are leakage currents from half-selected memory devices that flow while the read current flows through the selected memory device(s). Those leakage currents represent noise to the sense amps. A high S/N allows the sense amps to distinguish the signal that represents the read current from the signal that represents the leakage current. Consequently, the sense amps can generate a data signal that accurately represents the value of data stored in the selected memory device.

There are continuing efforts to improve technology for non-volatile memory devices.

BRIEF DESCRIPTION OF THE DRAWINGS

The invention and its various embodiments are more fully appreciated in connection with the following detailed description taken in conjunction with the accompanying drawings, in which.

Figure 1:
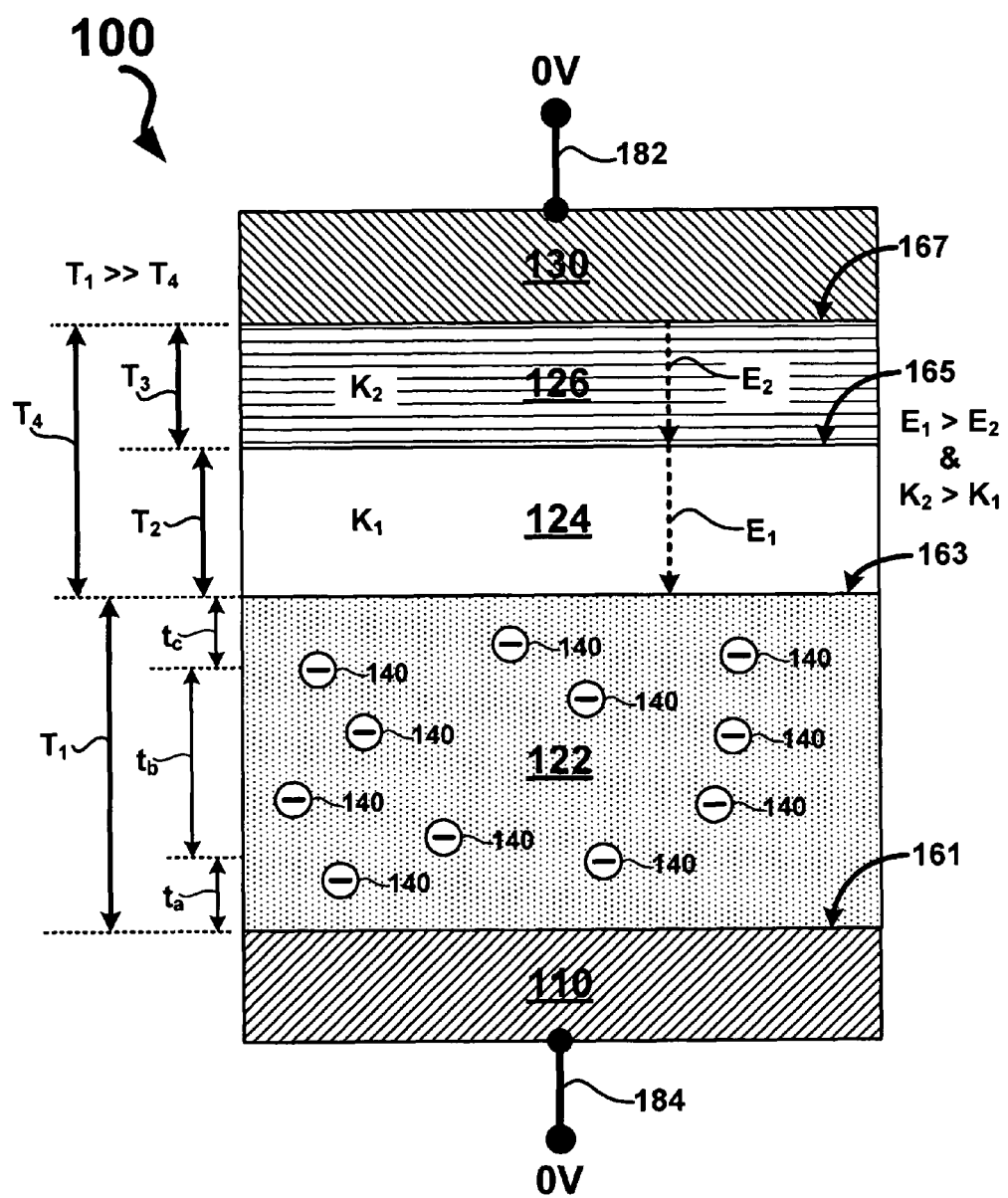
FIG. 1 depicts a cross-sectional view of a memory device.

Although the previous drawings depict various examples of the invention, the invention is not limited by the depicted examples. It is to be understood that, in the drawings, like reference numerals designate like structural elements. Also, it is understood that the depictions in the described drawings are not necessarily drawn to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, filed Mar. 30, 2005, published as U.S. Pub. No. 2006/0171200, and entitled "Memory Using Mixed Valence Conductive Oxides," which is herein incorporated by reference in its entirety and for all purposes, describes non-volatile third dimensional memory elements that may be arranged in a two-terminal, cross-point memory array that can be configured as a single layer of cross-point memory or as multiple vertically stacked layers of cross-point memory. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2.

Accordingly, the memory cells based on non-volatile memory can be fabricated BEOL over circuitry previously fabricated FEOL on a substrate (e.g., a silicon—Si wafer). An inter-level interconnect structure can be used to electrically couple the BEOL memory cells with the FEOL circuitry in the substrate below. Furthermore, the memory cells can be fabricated along with a two-terminal cross-point memory array that is fabricated BEOL above the aforementioned FEOL circuitry positioned on the substrate below. The FEOL circuitry fabricated on the substrate below (e.g., CMOS circuitry) can include circuitry for performing data operations (e.g., read, write, program, and erase) on two-terminal memory cells positioned in the two-terminal cross-point memory array and operative to store data as a plurality of conductivity profiles. The same or different FEOL circuitry can be used to access the memory cells.

FIG. 1 depicts an exemplary memory device 100 including a first electrically conductive layer 110 that can be an electrode (bottom electrode BE 110 hereinafter), at least one layer of a conductive oxide material 122 in contact with the BE 110, an electronically insulating layer 124 in contact with the layer 122, an ion barrier 126 in contact with the electronically insulating layer 124, and a second layer of an electrically conductive material 130 that can be an electrode (top electrode TE 130 hereinafter) in contact with the ion barrier 126. The electrodes 110 and 130 can be electrically coupled with terminals 184 and 182 respectively. Further, the layers 110, 122, 124, 126, and 130 are electrically in series with each other and with the terminals 182 and 184. Interfaces between adjacent layers of material are denoted as 161, 163, 165, and 167. Preferably, the layers 110, 122, 124, 126, and 130 are substantially planar and smooth such that the interfaces between adjacent layers are also substantially planar.

The layer 122 can be a single layer of a conductive oxide material having a thickness $T_1$ that is approximately 350 Å or less. On the other hand, the layer 122 can be made from two or more layers of a conductive oxide material with each of the plurality of layers having specific layer thicknesses. The plurality of layers of the conductive oxide material can be made from different types of conductive oxides. For example, if the layer 122 comprises two layers of conductive oxide, the bottommost layer can have a thickness $t_a$ and the uppermost layer can have a thickness $t_b$ where $t_b > t_a$. As another example, if the layer 122 comprises two layers of conductive oxide and assuming the bottommost layer is the layer having the thickness $t_b$ (i.e., the bottommost layer is does not have thickness $t_a$), the bottommost layer can have a thickness $t_b$ and the uppermost layer can have a thickness $t_c$ where $t_b > t_c$. As yet another example, if the layer 122 comprises three layers of conductive oxide, the bottommost layer can have a thickness $t_a$, the middle layer can have a thickness $t_b$, and the uppermost layer can have a thickness $t_c$, where $t_b > t_a$ and $t_b > t_c$. In the above examples, the layer $t_b$ has the greater thickness. For example if $t_b$ 250 Å, then $t_a$ and/or $t_c$ can be in a range from about 10 Å to about 50 Å. Typically, $t_a$ and/or $t_c$ are a fraction of the thickness of $t_b$, such that if $t_b$ is about 275 Å, then $t_a$ and/or $t_c$ can be about 30 Å or less, for example.

Conductive oxide layer 122 may be a conductive metal oxide (CMO), for example, a conductive perovskite material that typically exhibits memory characteristics. In some examples, conductive perovskites may comprise a mixed valence oxide having substantially mixed crystalline or polycrystalline perovskite structure. In other examples, perovskite materials, such as CMO, may include two or more metals being selected from a group of transition metals, alkaline earth metals and rare earth metals. Examples of conductive perovskite materials may include, but are not limited to: manganites (e.g., $PrCaMnO_X$—PCMO; $LaCaMnO_X$—LCMO; $LaSrMnO_X$—LSMO; $PrMnO_X$—PMO; and $LaSrCaMnO_X$—LSCMO); titanates (e.g., strontium titanate STO and a reduced STO); zirconates (SZO:Cr, CNO:Cr, TaO:Cr); $SrRuO_X$—SRO; $LaSrCrO_X$—LSCrO; $LaNiO_X$—LNO; $LaSrCrO_X$—LSCrO; $LaSrFeO_X$—LSFeO; and high Tc superconductors (e.g., YBCO). Conductive oxide layer 122 can be an electrically conductive binary oxide material including but not limited to a zinc oxide ($ZnO_X$) (e.g., $ZnO_2$) and a doped titanium oxide ($TiO_X$) (e.g., $TiO_2$). The titanium oxide ($TiO_X$) can be doped with a material including but not limited to niobium (Nb). The doping of the titanium oxide ($TiO_X$) can be accomplished by a process including but not limited to co-sputtering during deposition of the layer 122.

Electronically insulating layer 124 can comprise an electrolytic tunnel barrier layer, and may be formed from an insulating material (e.g., a dielectric material) configured to allow ion movement. The term electrolyte refers to a medium operative to allow ion transport, during write data operations, for example. Electronically insulating layer 124 formed as an electrolytic tunnel barrier layer can be understood to mean that layer 124 can be an electronic insulator and an ionic conductor. In some examples, the layer 124 can be an electrolyte to mobile ions 140 (e.g., oxygen—$O^-$ ions) and can be enabled to facilitate movement of mobile ions 140 in response to the aforementioned electric field in the memory device 100. The electronically insulating layer 124 is made from a material having a dielectric constant $K_1$. In some examples, layer 124 can be an electrolytic tunnel barrier layer, which can be implemented as a material that allows ionic movement and electron tunneling. For example, tunneling mechanisms for layer 124 can include but are not limited to single step tunneling processes (e.g., direct tunneling, Fowler-Nordheim tunneling, and thermionic field emission tunneling), multi-step tunneling processes (e.g., trap-assisted tunneling), and others. In yet other examples, suitable materials for layer 124 can include but are not limited to yttria-stabilized zirconia (YSZ), zirconia ($ZrO_X$) (e.g., $ZrO_2$), hafnium oxide ($HfO_X$) (e.g., $HfO_2$), gadolinium oxide ($GdO_X$), and erbium oxide ($ErO_X$) (e.g., $Er_2O_3$), where x>0. As one example, the layer 124 can be formed from YSZ sputter deposited on the layer 122 for approximately 4.5 minutes to achieve a thin film layer having a thickness $T_2$ of approximately 25 Å to 30 Å. As will be discussed below, the thickness $T_2$ of layer 124 can depend on a thickness $T_3$ of the ion barrier 126. A combined thickness of the layers 124 and 126 is denoted as thickness $T_4$. The relative thicknesses of $T_3$ and $T_2$ will be application dependent where in some applications $T_2 > T_3$, in other applications $T_2 \approx T_3$, and in yet other applications $T_3 > T_2$.

The ion barrier 126 is made from a dielectric material and can be an electronic insulator configured to prevent transport of ions 140 from the layer 124 (not shown) to the TE 130 as will be described below. The ion barrier 126 is made from a material having a dielectric constant $K_2$. Consequently, when write voltage potentials are applied to the terminals 182 and 184, an electric field is generated in the memory device 100. The resulting electric fields in the device 100 depend in part on the magnitude of the write voltage potentials, the thicknesses of the layers, and the dielectric constants (K) of the layers. A high dielectric constant $K_2$ for the ion barrier 126 can result in a lower magnitude of the electric field in the layer 126 denoted as $E_2$ and a low dielectric constant $K_1$ for the layer 124 can result in a higher magnitude of the electric field in the layer 124 denoted as $E_1$. Consequently, taking into account the write voltage potentials and the thicknesses for the layers 124 and 126, if $K_2$ is selected to be greater than $K_1$ (i.e., $K_2 > K_1$), then the magnitudes of the electric fields in the layers differ and $E_1 > E_2$. In some applications, the first dielectric constant $K_1$ can be greater than the second dielectric constant $K_2$ (i.e., $K_1 > K_2$).

A total thickness $T_4$ of the layers 124 and 126 (e.g., $T_4 = T_2 + T_3$) is selected to be approximately 50 Å or less to promote electron tunneling at voltages for data operations. To illustrate by way of an example, if the ion barrier 126 is omitted from memory device 100 and the TE 130 is in direct contact with the layer 124, then $T_4 = T_2$ and the thickness $T_2$ is selected to provide an electrical thickness that will allow electrons to tunnel at magnitudes for write voltages that are applied across terminals 182 and 184 (e.g., +2V applied to 182 and −2V applied to 184 for a write voltage of 4V). In this example, $T_2$ is approximately 35 Å. Now, adding the ion barrier back to the memory device 100, in order to maintain the same approximate electrical thickness that the memory device 100 had with $T_2$=35 Å, the thickness $T_3$ of the ion barrier 126 is selected to be approximately 10 Å and the thickness $T_2$ of the 124 is selected to be approximately 25 Å. The actual thicknesses for the layers 126 and 124 will be application dependent and will also depend on the materials selected for those layers.

Suitable dielectric materials for the ion barrier 126 include but are not limited to silicon oxide ($SiO_X$), aluminum oxide ($Al_xO_y$) (e.g., $Al_2O_3$), magnesium oxide ($MgO_X$), lanthanum aluminate (LAO) also referred to as lanthanum aluminum oxide ($LaAlO_X$) (e.g., $LaAlO_3$), and others. Further, ion barrier 126 can be formed from a material operative as a mobility barrier to mobile ions 140 (e.g., oxygen—$O^-$ ions), according to a conductivity formula, where σ=conductivity, n=number of ions, μ=ion mobility factor, and E=Fermi energy level required to transport an ion: σ=nμE As one example of fabrication of the layers 124 and 126, those layers can be sputter deposited for a combined deposition time of approximately 4.5 minutes resulting in a combined deposited thickness $T_4$=$T_2$+$T_3$ in a range from about 20 Å to about 35 Å. For example, if thickness $T_2$ of layer 124 is approximately 15 Å and thickness $T_3$ of layer 126 is approximately 17 Å, then $T_4$ can be approximately 32 Å.

In some examples, BE 110 and TE 130 can be formed as part of the structure of memory device 100. Here, electrodes 110 and 130 may be formed from an electrically conductive material, including, but not limited to, platinum (Pt), gold (Au), silver (Ag), iridium (Ir), ruthenium (Ru), palladium (Pd), aluminum (Al), tungsten (W), a noble metal, a noble metal alloy, refractory metals and their alloys, copper (Cu) that can be encapsulated with a cladding layer to prevent oxidation of the Cu, tin oxide ($SnO_X$), or a conductive oxide material, or others. Although not depicted in FIG. 1, electrodes 110 and 130 may each be configured to include one or more thin film layers. Those layers may include, but are not limited to, glue layers, diffusion barriers, adhesion layers, anti-reflection layers, and the like. For example, an adhesion layer (not shown) may be formed at interface 161 in order to promote adhesion between the materials of BE 110 and layer 122. Likewise, a glue layer (not shown) may be formed at interface 167 between ion barrier 126 and TE 130. In some examples BE 110 can refer to an electrode of memory device 100 that can be formed closer to a substrate (not shown) than the corresponding TE 130.

The layers 110, 122, 124, 126, and 130 can be formed to thicknesses determined by specific applications, using in some examples, fabrication and etching techniques known in the semiconductor art, and in other examples, non-etching techniques to form substantially planar layers. In yet other examples, the layers may be formed using microelectronics fabrication techniques that are well understood in the semiconductor art for forming thin films. By way of examples, fabrication techniques can include but are not limited to, physical vapor deposition (PVD), sputtering, reactive sputtering, co-sputtering, atomic layer deposition (ALD), chemical vapor deposition (CVD), molecular beam epitaxy (MBE), spin-on deposition, pulsed laser deposition, ion-beam deposition, electron-beam (e-beam) deposition, or thermal evaporation, just to name a few.

Figure 2:
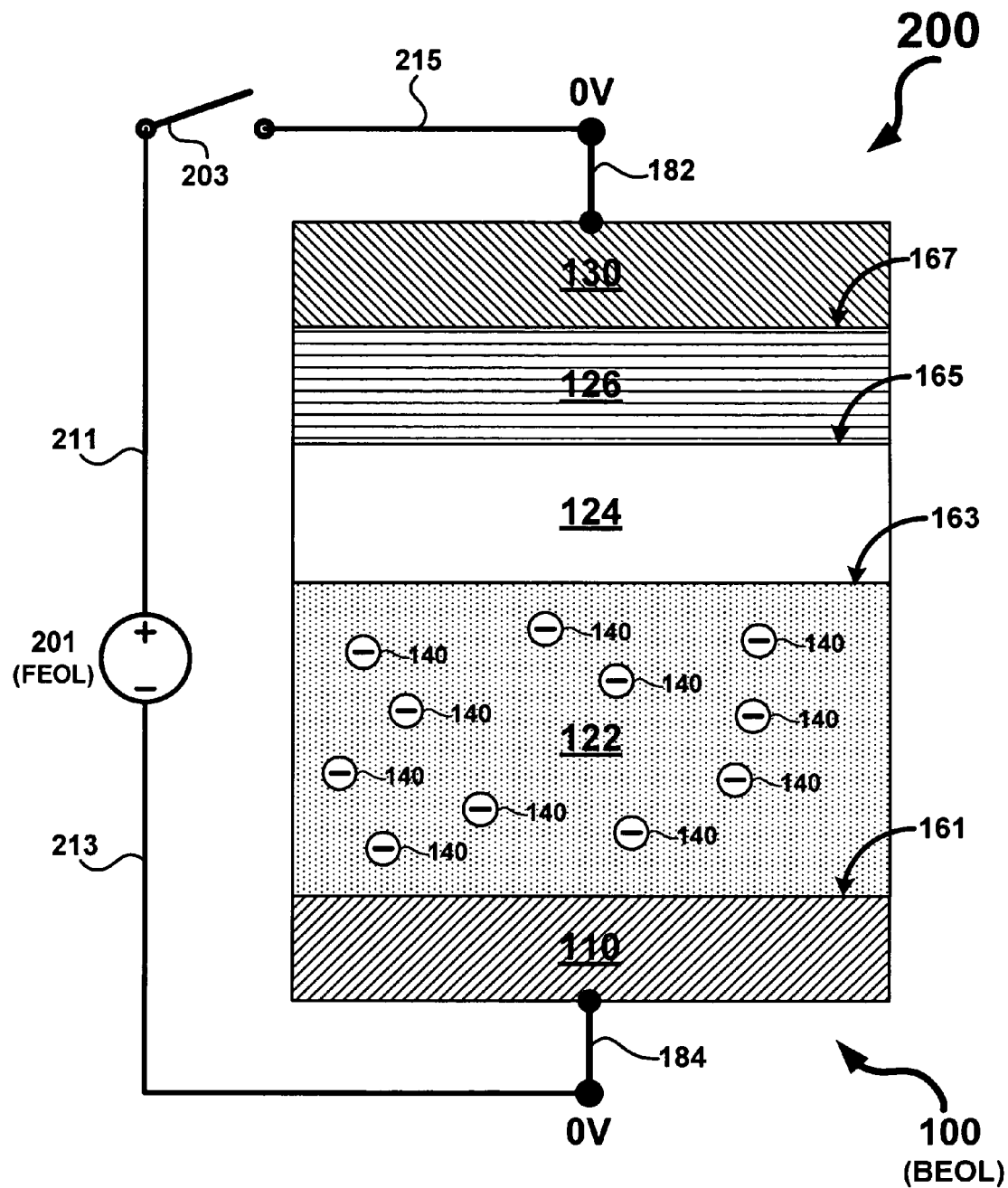
FIG. 2 depicts a cross-sectional view of a memory device and a voltage source for applying voltages for data operations on the memory device.

Attention is now directed to FIG. 2 where a configuration 200 depicts a voltage source 201 electrically coupled (213, 211, 203, and 215) with the terminals 182 and 184 of memory device 100. Switch 203 is depicted in an open position so that the voltage potentials applied to the terminals 182 and 184 is 0V. The voltage source 201 and at least a portion of the conductors 213, 211, and 215 can be FEOL structures fabricated on a substrate (e.g., a semiconductor such as a silicon—Si wafer) that includes active circuitry for performing data operations on the memory device 100. The memory device 100 can be fabricated BEOL directly above the substrate and electrically coupled with the active circuitry using an inter-level interconnect structure (not shown). Here switch 203 can represent FEOL electrical circuitry that connects or disconnects the voltage source 201 from terminals 182 and 184 in response to a control signal(s) during data operations to memory device 100.

Figure 3A:
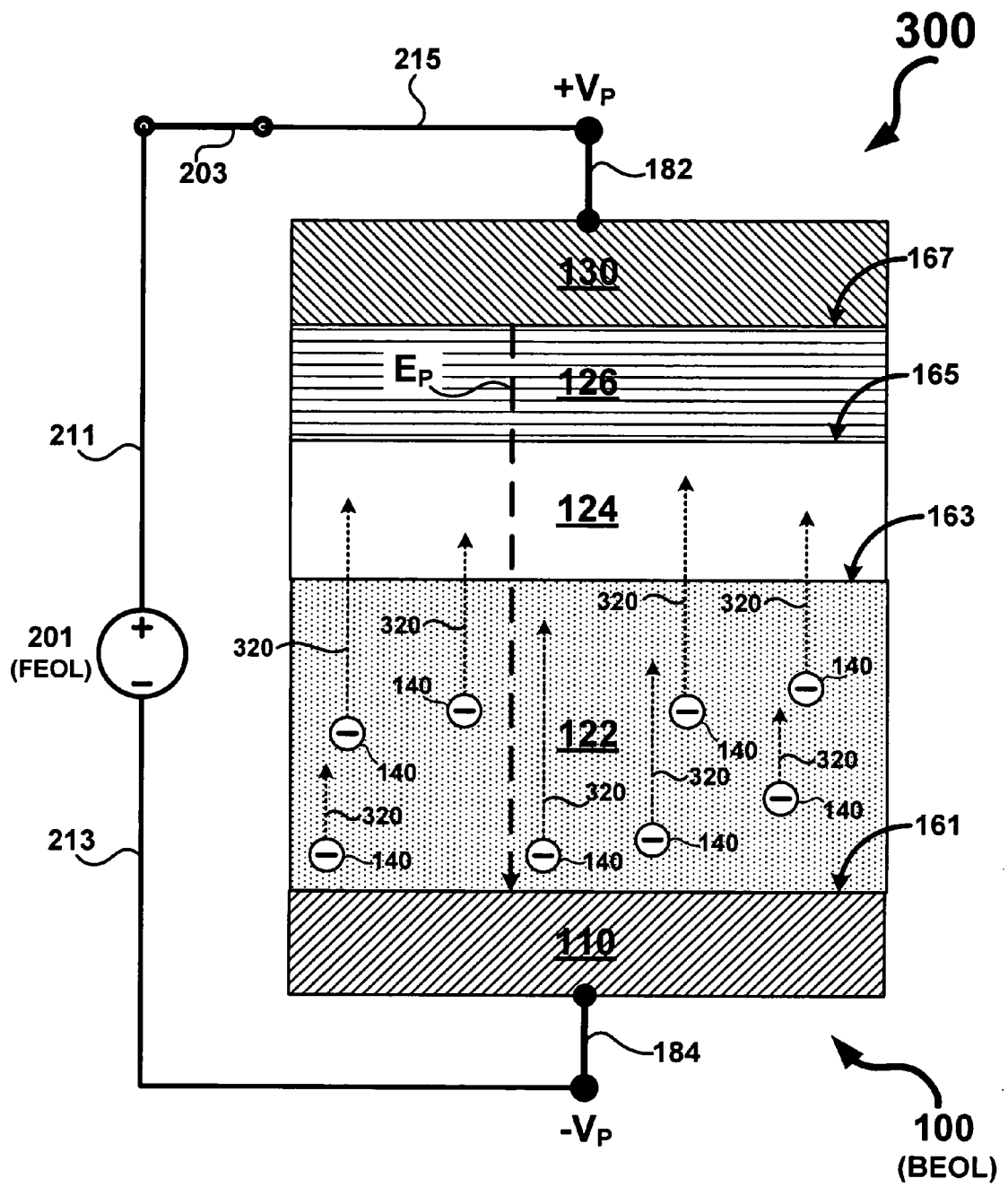
FIG. 3A depicts a cross-sectional view of a memory device during a programming data operation.

Reference is now made to FIG. 3A, where configuration 300 depicts a write operation on the memory device 100. Here, switch 203 is closed and voltage source 201 applies a programming voltage potentials $+V_P$ and $-V_P$ across the terminals 182 and 184. An electric field $E_P$ is generated by the application of the programming voltages and a portion of the mobile ions 140 are transported 320 from the layer 122 and into the layer 124 as denoted by the dashed arrows for 320. The example depicted in FIG. 3A assumes that the mobile ions 140 are negatively charged (e.g., negatively charged oxygen–$O^-$ ions) and move in a direction opposite to the electric field E. However, the mobile ions 140 need not be negatively charged as depicted in FIG. 3A, and depending on the material selected for the layer 122, the mobile ions 140 can be positively charged. As was described above, the dielectric constant $K_1$ for the layer 124 results in an electric field $E_1$ in the layer 124 that is operative to transport 320 the mobile ions 140 past the interface 163 and deeper into the layer 124. The layer 124 is made from a material that is permeable to the mobile ions 140 and allows transport of the mobile ions 140 into and out of the layer 124 during write operations.

Figure 3B:
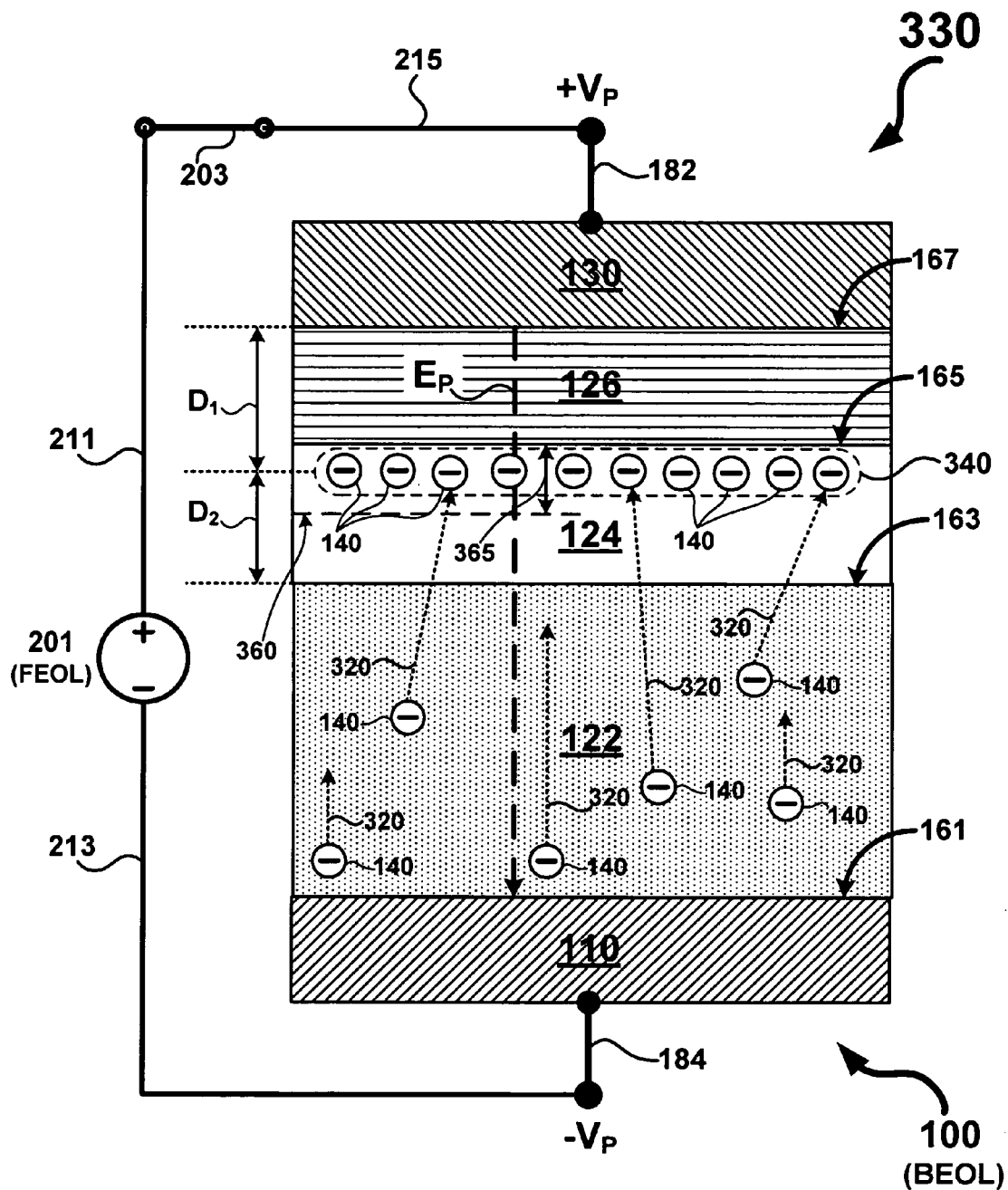
FIG. 3B depicts a cross-sectional view of ion motion in the memory device of FIG. 3A during the programming operation.

Moving on to FIG. 3B, a configuration 330 depicts mobile ion 140 movement 320 sometime after the programming voltages were applied and with the switch 203 still in the closed position. As can be seen, some portion of the mobile ions 140 are not transported 320 out of the layer 122 and remain there. However, another portion of the mobile ions 140 have been transported 320 into the layer 124 and a significant percentage of those transported ions 140 are now clustered 340 and positioned adjacent to the interface 165 between the electronically insulating layer 124 and the ion barrier 126. The ion barrier 126 is not permeable to the mobile ions 140 and so the mobile ions 140 do not penetrate into the layer 126 and do not come into close proximity to the interface 167 between the ion barrier 126 and TE 130 and do not come into contact with the TE 130. Due to the higher dielectric constant $K_2$ of the ion barrier 126, the magnitude of the electric field $E_2$ in the ion barrier 126 is lower than the electric field $E_1$ in the electronically insulating layer 124. Consequently, the ion barrier 126 can serve as a physical barrier to the mobile ions 140, an electrical barrier to the mobile ions 140, or both.

The cluster 340 of ions 140 is positioned at an approximate distance $D_1$ from the interface 167 and an approximate distance $D_2$ from the interface 163; where the distances $D_1$ and $D_2$ can depend in part on the thicknesses $T_3$ and $T_2$ of the layers 126 and 124 respectively. In some applications the distances $D_1$ and $D_2$ can be different from each other and in other applications they can be approximately equal to each other. Preferably, the cluster 340 of ions 140 is approximately positioned between the interface 165 and a midpoint of the thickness $T_2$ so that the cluster 340 of ions 140 are approximately positioned at or above the midpoint for the layer 124 as denoted by a dashed line 360 and an arrow 365 extending between the dashed line 360 and the interface 165. Not all of the ions 140 that are transported 320 into the layer 126 will be located in the region defined by the cluster 340. There will be some portion of the transported ions 140 that will not be positioned in the preferred region defined by the arrow 365; however, a majority of the transported ions 140 will be positioned in cluster 340 in the region defined by the arrow 365.

On advantage of the ion barrier 126 is that it can separate the charge on the ions 140 (e.g., negative charge) from opposing electrical charges (e.g., positive charge) at the interfaces 167 and 163. Absent the ion barrier 126, direct contact between the TE 130 and the electronically insulating layer 124 can create a compensating charge of opposite polarity at an interface (not shown) between the TE 130 and the electronically insulating layer 124. For example, using the same polarity of the programming voltages ($+V_P$, $-V_P$), electrons movement from the TE 130 can generate positively charged holes that can compensate (e.g., neutralize) the negative on ions 140 in the electronically insulating layer 124 that are positioned adjacent to the interface. Similarly, the transport 320 of the ions 140 from the layer 122 can generate compensating oppositely charged vacancies in the layer 122 that can compensate (e.g., neutralize) the negative on ions 140 in the electronically insulating layer 124.

Now, referring back to the configuration 300 of FIG. 3B, the inclusion of the ion barrier 126 in the memory device 100 is operative to create spatial separation (e.g., physical separation caused by distances $D_1$ and $D_2$) between the cluster 340 of ions 140 and any opposite polarity charges present at interfaces 167 and 163. The spatial separation prevents any screening effect created by positive charged carriers and negative charged carriers neutralizing each other.

Figure 3C:
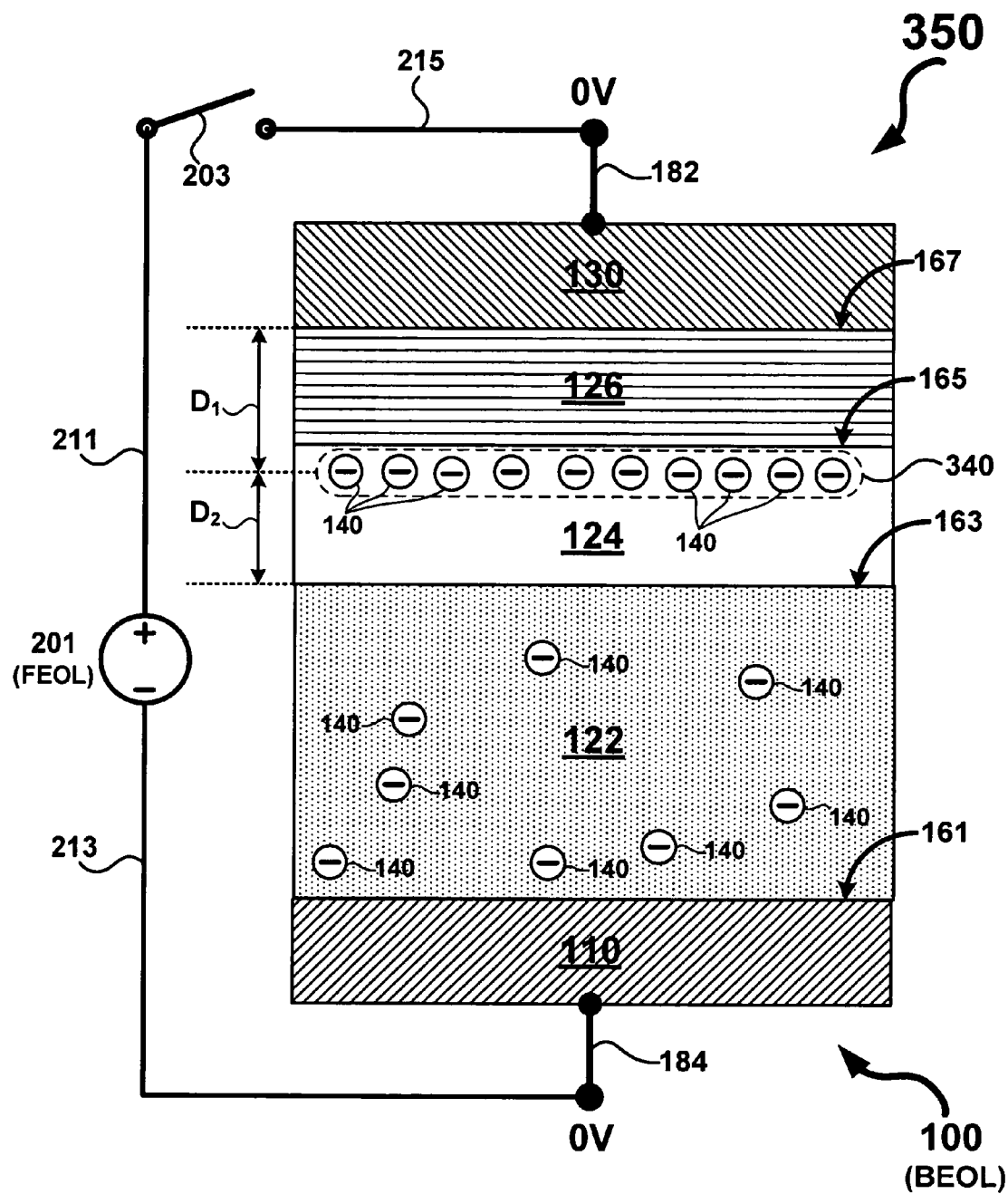
FIG. 3C depicts a cross-sectional view of the memory device storing non-volatile data in a programmed state after the programming operation of FIG. 3B.

Attention is now directed to FIG. 3C where a configuration 350 depicts switch 203 open so that the programming voltages are no longer applied to terminals 182 and 184. Here, the ions 140 in cluster 340 have not changed position and remain in the electronically insulating layer 124. The transport 320 of the mobile ions 140 from the layer 122 has decreased the conductivity of the layer 122 so that the memory device 100 has a higher resistance in the programmed state. The transport 320 of the mobile ions 140 can also increase a resistance of the electronically insulating layer 124 and the higher resistance of the memory device 100 in the programmed state can be attributed to the decrease in conductivity of the layer 122, the increased resistance of the layer 124, or both. The memory device 100 stores data as a plurality of conductivity profiles that can be reversibly changed by applying write voltages across terminals 182 and 184. The programmed state depicted in FIG. 3C is one of the plurality of conductivity profiles and the programmed state is retained in the absence of electrical power (e.g., 0V on terminals 182 and 184) such the memory device 100 is non-volatile. As will be described in greater detail below, the programmed state can be non-destructive read by applying a read voltage across the terminals 182 and 184 and sensing a read current that flows through the memory device 100. A magnitude of the read current is indicative of the value of data stored in the memory device 100.

Figure 4A:
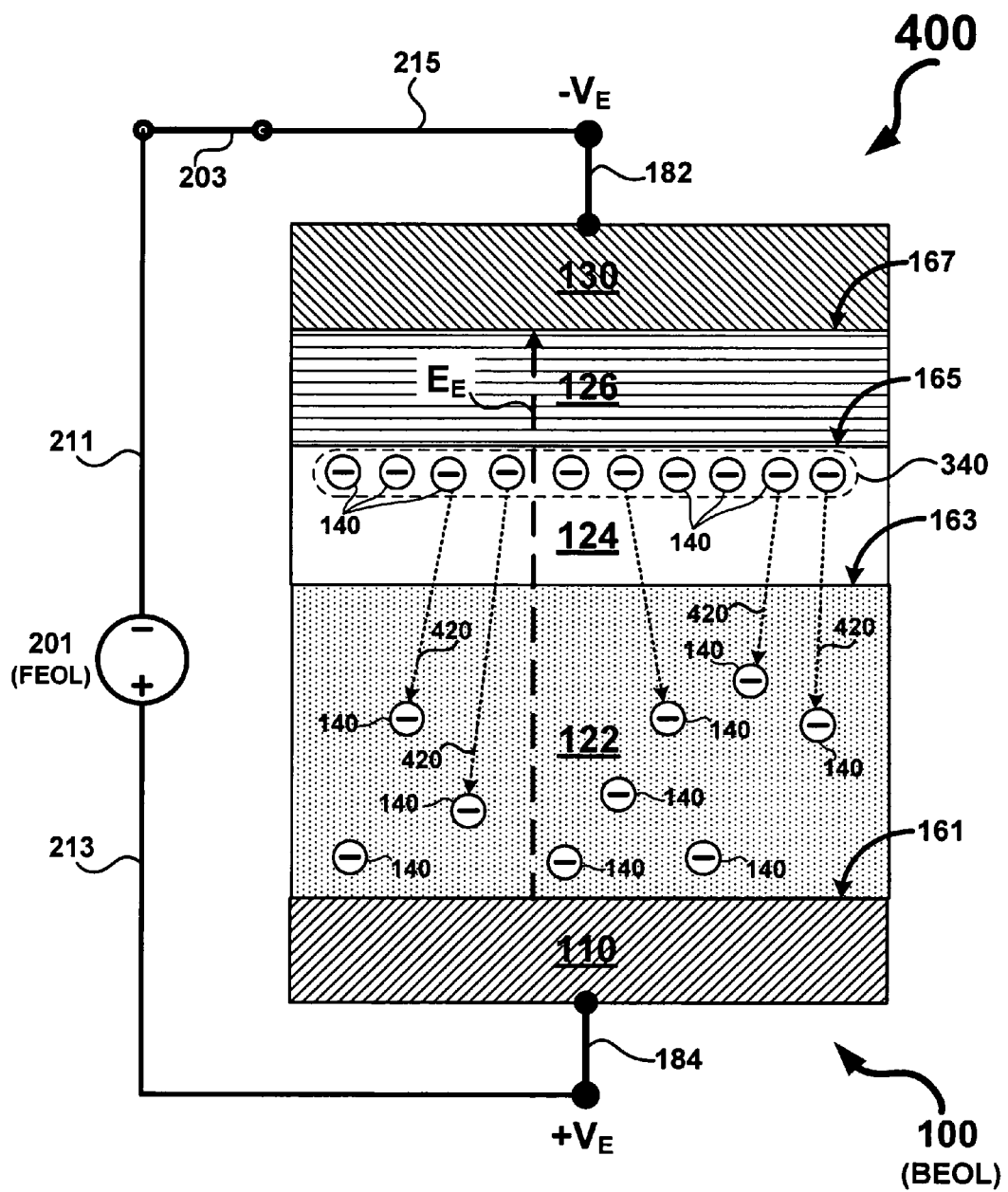
FIG. 4A depicts a cross-sectional view of a memory device during an erase data operation.

Reference is now made to FIG. 4A where a configuration 400 depicts the switch 203 closed and voltage source 201 applying erase voltage potentials $+V_E$ and $-V_E$ to the terminals 182 and 184 during an erase data operation on the memory device 100 that operative to write an erased conductivity value to the memory device 100. Here, the opposite polarities of the erase voltage potentials $+V_E$ and $-V_E$ are operative to generate and electric field $E_E$ having a direction opposite that of the electric field $E_P$ depicted in FIG. 3B. Accordingly, the mobile ions 140 positioned in the cluster 340 and elsewhere in the electronically insulating layer 124 are transported 420 in a direction opposite the electric field $E_E$ and back into the layer 122.

Figure 4B:
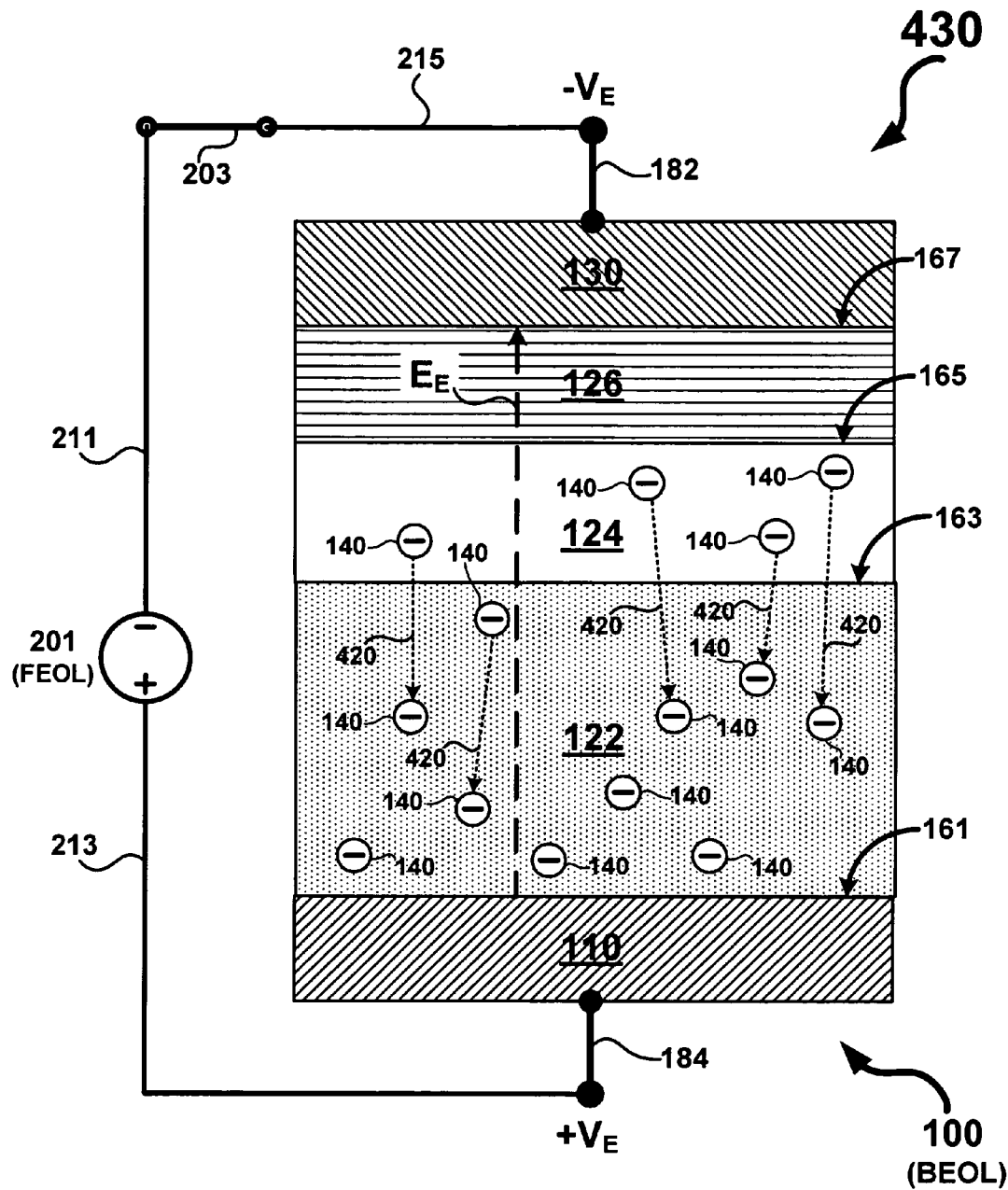
FIG. 4B depicts a cross-sectional view of ion motion in the memory device of FIG. 4A during the erase operation.

In FIG. 4B, a configuration 430 depicts continued transport 420 of the mobile ions 140 from the electronically insulating layer 124 and into the conductive oxide layer 122. As was described above, one advantage of the ion barrier 126 is that it reduces the energy required to reverse the memory device 100 from the programmed state depicted in FIGS. 3A-3C to the erased state. Here, that reduction in energy can be manifested in a lower magnitude for the erase voltages $+V_E$ and $-V_E$ than would be the case if memory device 100 did not include the ion barrier 126 and the electronically insulating layer 124 was in direct contact with the TE 130.

Figure 4C:
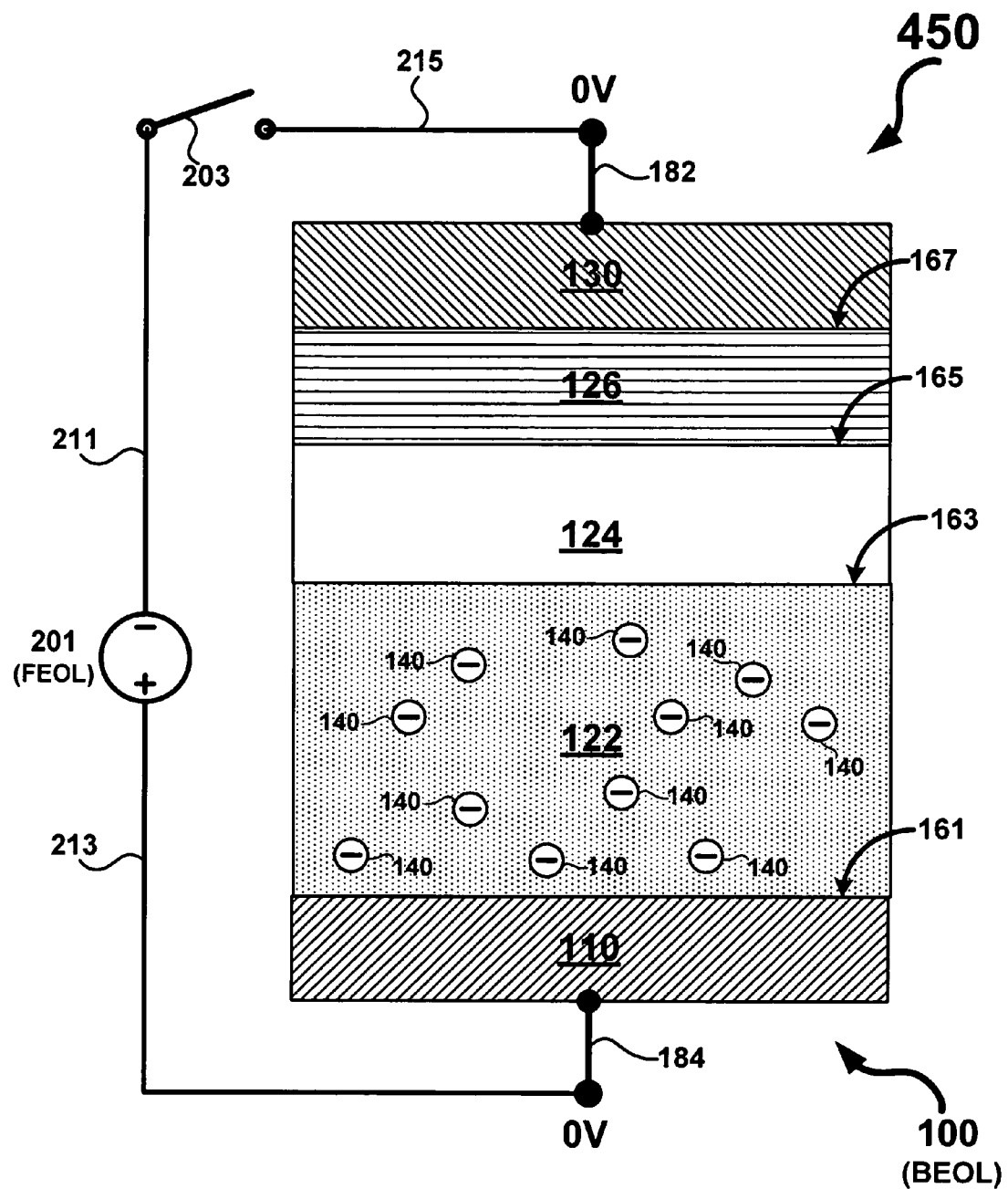
FIG. 4C depicts a cross-sectional view of the memory device storing non-volatile data in an erased state after the erase operation of FIG. 4B.

Reference is now made to FIG. 4C, where the switch 203 is open and the erase voltages $+V_E$ and $-V_E$ are no longer being applied to the terminals 182 and 184. A substantial majority of the mobile ions 140 of the mobile ions 140 that were positioned in the electronically insulating layer 124 have been transported back into the conductive oxide layer 122 and a conductivity of the conductive oxide layer 122 has increased and a resistance of the memory device 100 has decreased such that the memory device 100 now stores data as an erased conductivity profile. As described above, the erased conductivity profile is non-volatile, is retained in the absence of power, and can be non-destructively determined by applying a read voltage across the terminals 182 and 184.

Figure 5A:
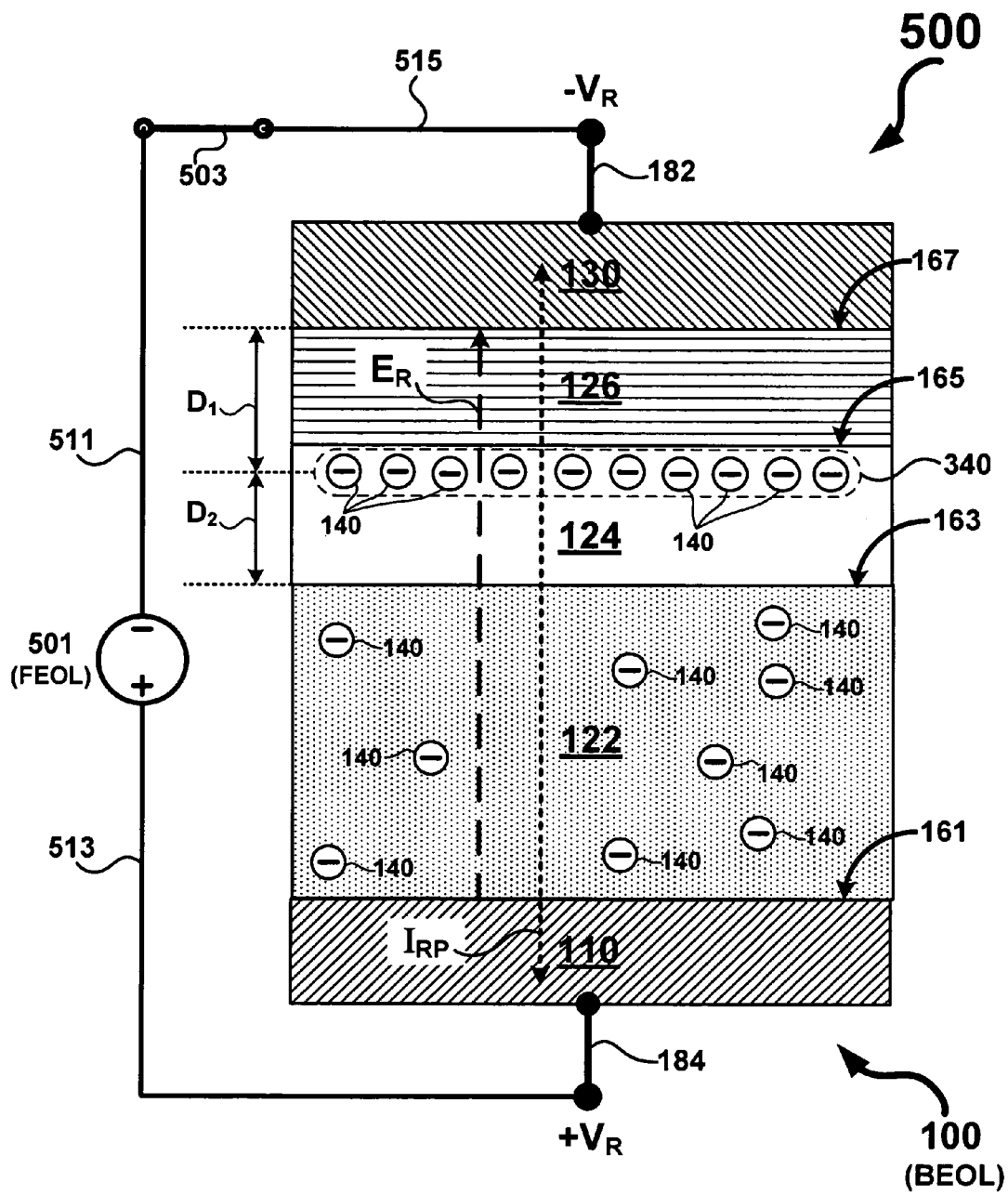
FIG. 5A depicts a cross-sectional view of a memory device storing non-volatile data in a programmed stated during a read operation.
Figure 5B:
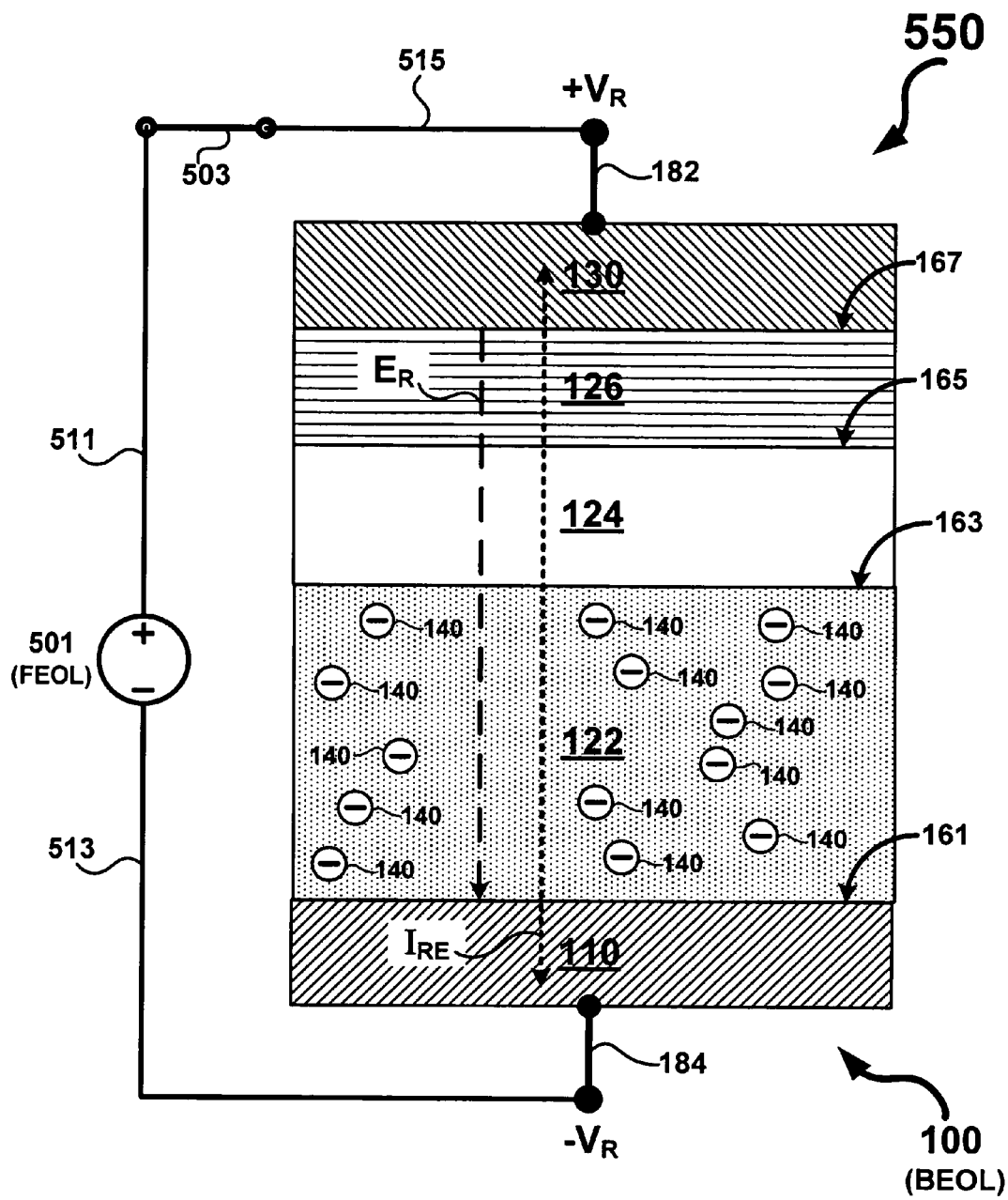
FIG. 5B depicts a cross-sectional view of a memory device storing non-volatile data in an erased stated during a read operation.

FIGS. 5A and 5B depict non-destructive read data operations on the memory device 100 storing programmed and erased conductivity profiles respectively. In FIG. 5A, a voltage source 501 is electrically coupled 511, 513, and 515 with the terminals 182 and 184 via a switch 503 that can be opened and closed in response to a signal to apply read voltage potentials generated by voltage source 501 to the terminals 182 and 184. Here, the switch 503 is depicted as closed and voltage source 501 applies read voltage potentials $+V_R$ and $-V_R$ to terminals 182 and 184 and generates an electric field $E_R$. Unlike the electric fields $E_P$ and $E_E$, a magnitude of the electric field $E_R$ is less than the magnitudes of the electric fields $E_P$ and $E_E$ because the magnitudes of the read voltage potentials $+V_R$ and $-V_R$ are less than the write voltage potentials depicted in FIGS. 3A-4C. Consequently, the programmed state of memory device 100 depicted in FIG. 5A is not disturb or overwritten by the application of the lower magnitude read voltage potentials $+V_R$ and $-V_R$. As a result, the mobile ions 140 in cluster 340 or positioned elsewhere in the electronically insulating layer 124 are not transported or otherwise displaced by the lower magnitude electric field $E_R$ and the cluster 340 of ions 140 is positioned at the approximate distance $D_1$ from the interface 167 and the approximate distance $D_2$ from the interface 163. The application of the read voltage potentials $+V_R$ and $-V_R$ is operative to generate a read current $I_{RP}$ having a magnitude that is indicative of the programmed conductivity profile (e.g., high resistance) of the memory device 100. The high resistance of the programmed conductivity profile can result in a lower magnitude read current $I_{RP}$ when compared to the read current generated by the lower resistance erased conductivity profile as will be described below. The larger the difference between the erased and programmed conductivity profiles, the easier it is for sense circuitry that senses the read current $I_{RP}$ to distinguish between the current signal for a programmed state and the current signal for an erased state.

Turning now to FIG. 5B, the memory device 100 is depicted in the erased state and the voltage source 501 applies the read voltage potentials $+V_R$ and $-V_R$ in a polarity opposite that depicted in FIG. 5A so that the electric field $E_R$ points in the opposite direction. Here, the mobile ions 140 positioned in the conductive oxide layer 122 are not displaced or transported out of the layer 122 by the electric field $E_R$. Consequently, the erased conductivity profile is not disturb or overwritten by the application of the read voltage potentials $+V_R$ and $-V_R$. The application of the read voltage potentials $+V_R$ and $-V_R$ is operative to generate a read current $I_{RE}$ having a magnitude that is indicative of the erased conductivity profile (e.g., low resistance) of the memory device 100. Here, using a convention where programmed memory devices 100 stores data as a high resistance state and erased memory devices 100 stores data as a low resistance state, one skilled in the art will appreciate and understand that for the same magnitude of applied read voltage potentials $+V_R$ and $-V_R$, a magnitude of the read current $I_{RE}$ in FIG. 5B is greater than a magnitude of the read current $I_{RP}$ in FIG. 5A because the resistance of the memory device 100 is lower in FIG. 5B and higher in FIG. 5A.

It should be noted that the polarity of read voltages in FIGS. 5A and 5B can be the reverse of what is depicted and in some applications the active circuitry that applies the read voltages can be configured to alternate the polarities of the applied read voltages. The voltage sources that apply the read and write voltages can be separate voltage specifically configured to generate voltages for read operations only or write operations only, of the same voltage source configured to generate write voltages during write operations (e.g., program or erase operations) or read voltages during read operations. Although a single voltage source (201 or 501) is depicted, in some applications the terminals 182 and 184 can be electrically coupled with different voltage sources for applying the read voltage potentials, the write voltage potential, or both.

Figure 6:
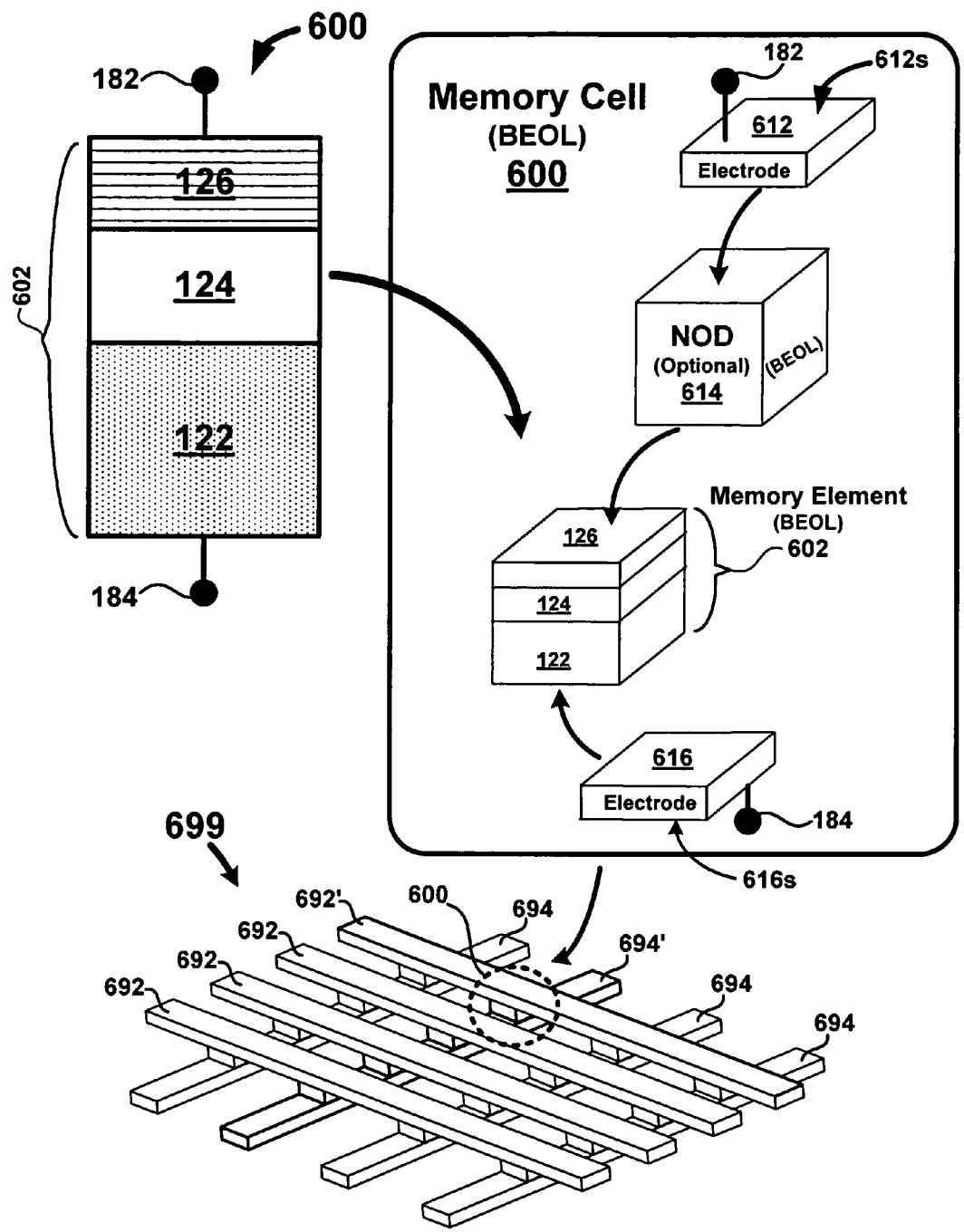
FIG. 6 depicts an example of a memory cell and a plurality of memory cells positioned in a two-terminal cross-point array according to various embodiments of the invention.

FIG. 6 depicts an example of arrayed memory cells according to various embodiments of the invention. In this example, a memory cell 600 includes a memory element 602. The memory element 602 includes the layers 122, 124, and 126 as described above. Memory cell 600 further includes the two terminals 182 and 184. Terminals 182 and 184 can be electrically coupled with or can be formed as electrodes 612 and 616. The layers 122, 124, and 126 are electrically in series with the electrodes 612 and 616. Electrodes (612, 616) can be made from an electrically conductive material including but not limited to, platinum (Pt), gold (Au), silver (Ag), iridium (Ir), iridium oxide ($IrO_X$), ruthenium (Ru), palladium (Pd), aluminum (Al), alloys of those materials, and the like.

In at least some embodiments, memory cell 600 can include a non-ohmic device (NOD) 614, which, in turn, can be formed on the memory element 602 (e.g., either above or below memory element 602). NOD 614 can be a "metal-insulator-metal" (MIM) structure that includes one or more thin film layers of electronically insulating material that are in contact with one another and sandwiched between metal layers (e.g., electrodes), or NOD 614 can be a pair of diodes connected in a back-to-back configuration. U.S. patent application Ser. No. 11/881,473, filed Jul. 26, 2007, now U.S. Published Application No. 2009-0027976 A1, and entitled "Threshold Device For A Memory Array" and U.S. patent application Ser. No. 12/283,339, filed Sep. 11, 2008, now U.S. Published Application No. 2009-0016094 A1, and entitled "Selection Device for Re-Writable Memory" are both hereby incorporated by reference in their entirety and for all purposes and describe metal-insulator-metal and diode based non-ohmic devices. Memory cell 600 can be formed between conductive array lines, such as array lines 692' and 694'. Thus, memory cell 600 can be formed in an array of other memory cells, the array can be a cross-point array 699 including groups of conductive array lines 692 and 694. For example, array lines 692 can be electrically coupled with the electrodes 612 of the memory cells 600 and/or may be in contact with a surface 612s of the electrodes 612 and array lines 694 can be electrically coupled with the electrodes 616 of the memory cells 600 and/or may be in contact with a surface 616s of the electrodes 616.

Figure 6A:
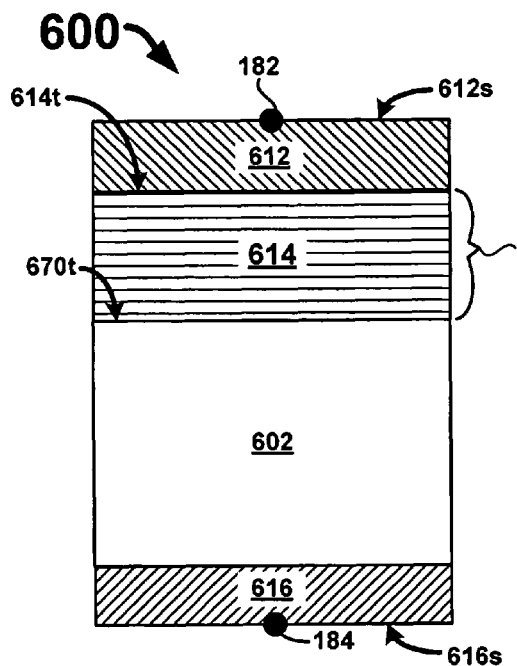
FIG. 6A depicts one example of a memory cell that includes a memory element electrically in series with a non-ohmic device.
Figure 6B:
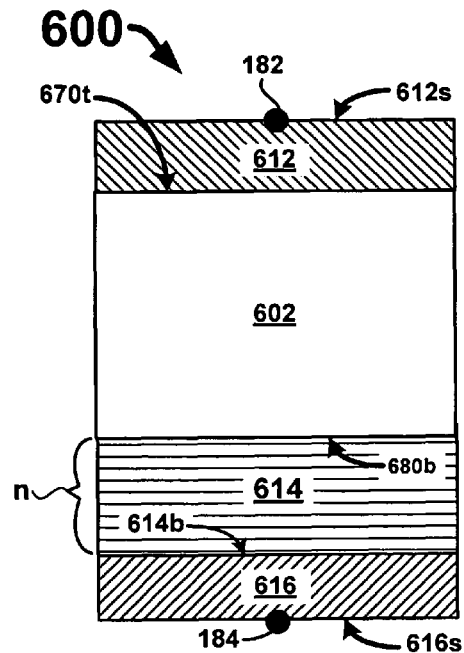
FIG. 6B depicts another example of a memory cell that includes a memory element electrically in series with a non-ohmic device.

Moving now to FIGS. 6A and 6B, memory cells 600 include the non-ohmic device 614. The non-ohmic device 614 is electrically in series with the memory element 602 and the pair of electrodes (612, 616). As was discussed above, each memory cell 600 stores data as a plurality of conductivity profiles. Therefore, each memory element 602 can be schematically depicted as a resistor that is electrically in series with the non-ohmic devices 614. A resistance at a certain voltage of a specific memory element 602 is indicative of a value of data stored in that memory element 602. As an example, each memory element 602 can store a single bit of data as one of two distinct conductivity profiles having a first resistive state $R_0$ at a read voltage $V_R$ indicative of a logic "0" and a second resistive state $R_1$ at $V_R$ indicative of a logic "1", where $R_0 \neq R_1$. Preferably, a change in conductivity, measured at the read voltage $V_R$, between $R_0$ and $R_1$ differs by a large enough factor so that a sense unit that is electrically coupled with the memory element 602 can distinguish the $R_0$ state from the $R_1$ state. For example, the factor can be at least a factor of approximately 5. Preferably, the predetermined factor is approximately 10 or more (e.g., $R_0 \approx 1$ M$\Omega$ and $R_1 \approx 100$ k$\Omega$). The larger the predetermined factor is, the easier it is to distinguish between resistive states $R_0$ and $R_1$. Furthermore, large predetermined factors may also allow intermediate resistive states (e.g., $R_{00}$, $R_{01}$, $R_{10}$, and $R_{11}$).

The resistance of the memory element 602 may not be a linear function of the voltage applied across the memory element 602 at the electrodes (612, 616). Therefore, a resistance $R_S$ of the memory elements 602 can approximately be a function of the applied voltage V such that $R_S \approx f(V)$. The applied voltage V can be a read voltage, a write voltage, or a half-select voltage. Moreover, because the non-ohmic devices 614 are electrically in series with their respective memory element 602, a resulting series resistance creates a voltage drop across the non-ohmic devices 614 such that the actual voltage across the memory element 602 will be less than the voltage applied across the electrodes (612, 616). As one example, if the read voltage $V_R \approx 3V$ and the voltage drop across the non-ohmic devices 614 is approximately 2.0V, then an effective read voltage across the memory element 602 is approximately 1.0V.

The non-ohmic devices 614 create a non-linear I-V characteristic curve that falls within a desired operational current-voltage range for data operations (e.g., read and write operations) to the memory element 602. The non-ohmic devices 614 substantially reduce or eliminate current flow when the memory element 602 is not selected for a read or write operation. The non-ohmic devices 614 allow data to be written to the memory element 602 when a write voltage $V_W$ of appropriate magnitude and polarity is applied across the electrodes (612, 616) of a selected memory element 602. Similarly, the non-ohmic devices 614 allow data to be read from the memory element 602 when a read voltage $V_R$ of appropriate magnitude and polarity is applied across the electrodes (612, 616) of a selected memory element 602. An additional function of the non-ohmic devices 614 is to substantially reduce or eliminate current flow through half-selected and un-selected memory elements 602.

The non-ohmic devices 614 may include a plurality of layers of thin film materials that are in contact with one another and are denoted as n in FIGS. 6A and 6B. Those layers can include a pair of electrodes that sandwich one or more layers of a dielectric material. The dielectric material(s) are operative as a tunnel barrier layer(s) that generate the non-linear I-V characteristic of the non-ohmic devices 614. As one example, the non-ohmic devices 614 can comprise a sandwich of Pt electrode/TiO$_X$ dielectric layer/Pt electrode. The thicknesses of the Pt and TiO$_X$ materials will be application dependent. The Pt electrodes may have a thickness in a range from about 500 Å to about 100 Å, for example. The TiO$_X$ dielectric layer may have a thickness in a range from about 50 Å to about 10 Å, for example. Examples of suitable materials for the dielectric layers for the non-ohmic devices 614 include but are not limited to SiO$_2$, Al$_2$O$_3$, SiN$_X$, HfSiO$_X$, ZrSiO$_X$, Y$_2$O$_3$, Gd$_2$O$_3$, LaAlO$_3$, HfO$_2$, ZrO$_2$, Ta$_2$O$_5$, TiO$_X$, yttria-stabilized zirconia (YSZ), Cr$_2$O$_3$, and BaZrO$_3$. Suitable materials for the electrically conductive layers for the electrodes of the non-ohmic devices 614 include but are not limited to metals (e.g., aluminum Al, platinum Pt, palladium Pd, iridium Ir, gold Au, copper Cu, tantalum Ta, tantalum nitride TaN, titanium (Ti), and tungsten W), metal alloys, refractory metals and their alloys, and semiconductors (e.g., silicon Si). Alternatively, the non-ohmic devices 614 can include a pair of diodes connected in a back-to-back configuration (not shown), for example. Each of the diodes can be manufactured to only allow current to flow in a certain direction when its breakdown voltage (of a predetermined magnitude and polarity) is reached.

In FIG. 6A, the non-ohmic device 614 is positioned adjacent to electrode 612; whereas, in FIG. 6B, the non-ohmic device 614 is positioned adjacent to electrode 616. In some applications, the material for the pair of electrodes (612, 616) will be compatible with the electrode material for the non-ohmic devices 614. In those applications, one of the pair of electrodes (612, 616) can serve as one of the electrodes for the non-ohmic devices 614.

Figure 6C:
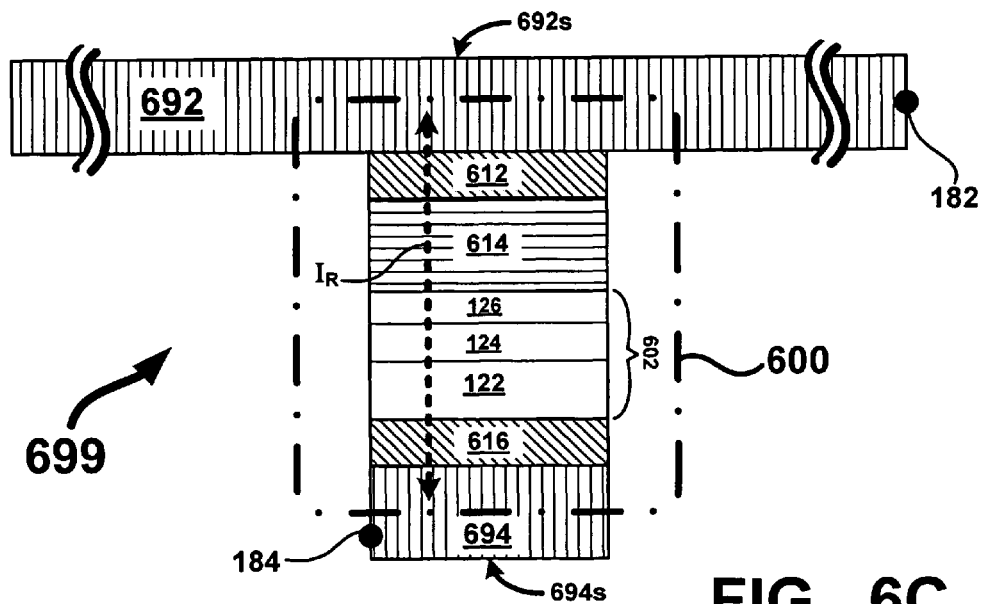
FIG. 6C depicts a memory cell positioned between a cross-point of two conductive array lines.

Reference is now made to FIG. 6C, where a portion of the cross-point array 699 includes a plurality of first conductive array lines 692 (one is depicted) and a plurality of second conductive array lines 694 (one is depicted), and a plurality memory cells 600 (one is depicted). Each memory cell 600 includes a first terminal 182 in electrical communication with only one of the first conductive array lines 692 and a second terminal 184 in electrical communication with only one of the second conductive array lines 694. Each memory cell 600 includes a memory element 602 that is electrically in series with the first and second terminals (182, 184). The first and second terminals (182, 184) can be the pair of electrodes (612, 616) described in reference to FIGS. 6, 6A, and 6B. As depicted in FIG. 6C, the memory cell 600 may include the above mentioned non-ohmic devices 614. The non-ohmic device 614 is electrically in series with the first and second terminals (182, 184) and with the memory element 602. The position of the non-ohmic device 614 in the memory cell 600 can be as depicted or the non-ohmic device 614 can be positioned between the second terminal 184 and the memory element 602. Although, non-ohmic device 614 is depicted, the memory cell 600 need not include a non-ohmic device 614 and the first terminal 182 may be in contact with the memory element 602.

Although a coordinate system is not depicted, the first conductive array lines 692 may be substantially aligned with an X-axis (e.g., running from left to right on the drawing sheet) and the second conductive array lines 694 may be substantially aligned with a Y-axis (e.g., looking into the drawing sheet). The aforementioned read and write and voltages are applied to a selected memory cell 600 by applying the voltages across the two conductive array lines that the memory cell 600 is positioned between. In FIG. 6C, by applying the read and write and voltages across the terminals (182, 184), stored data can be read from the selected memory cell 600 or new data can be written to the selected memory cell 600. A read current I$_R$ flows through the selected memory cell 600, the memory element 602, and the non-ohmic device 614, if it is included in the memory cell 600. The direction of flow of the read current I$_R$ (e.g., substantially along a Z-axis) will depend on the polarity of the read voltage. For example, if a positive read voltage potential is applied to terminal 182 and a negative read voltage potential is applied to the terminal 184, then the read current I$_R$ will flow from the first conductive array line 692 to the second conductive array line 694. In some applications, the memory cell 600 comprises the smallest repeatable unit that makes up the array 699 and may include all or a portion of the conductive array lines (692, 694) as denoted by the dashed line for the memory cell 600. One skilled in the art will appreciate that a dielectric material such as silicon oxide (SiO$_X$), silicon nitride (SiN$_X$), or the like may be used to electrically isolate adjacent memory cells 600 from one another and to fill in open areas within the array 699.

Figure 6D:
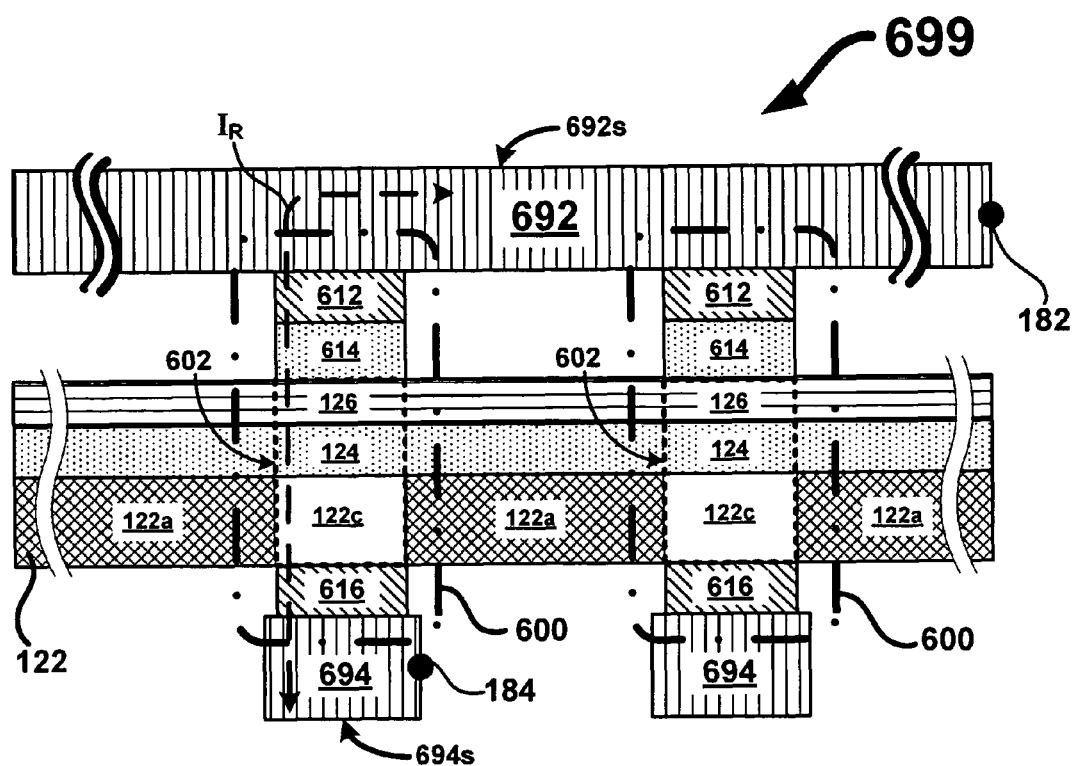
FIG. 6D depicts a plurality of memory cells including memory element with continuous and unetched layers and positioned between cross-points of conductive array lines.

Attention is now directed to FIG. 6D, where the array 699 includes a plurality of memory cells 600. However, unlike the memory cell 600 of FIG. 6C, where the memory element 602 comprises discrete (e.g., etched) layers for the layers 122, 124, and 126 in memory element 602, and those layers are substantially vertically aligned with other thin film layers (e.g., the electrodes) in the memory cell 600, the memory cells 600 of FIG. 6D comprise continuous and unetched layers of material for the layers 122, 124, and 126. In FIG. 6D, for each memory element 602 (shown in dashed outline), portions 122c of the conductive oxide layer 122 that are positioned substantially within the dashed outline for the memory element 602 are crystalline in structure and are electrically conductive. In contrast, portions 122a that are positioned substantially outside the dashed outline are amorphous in structure and are electrically insulating and may be referred to as insulating oxide regions 122a. The regions 122a electrically isolate adjacent memory cells 600 and their respective memory elements 602 from one another. For example, when a read voltage is applied across terminals 182 and 184, the resulting read current I$_R$ flows through the memory cell 600 on the left and does not electrically interact with the memory cell 600 on the right due to the insulating properties of the IMO regions 122a. The regions 122a can be formed by ion implantation of portions of the layer 122 during fabrication. Layers of thin film materials positioned above layer 126 may be used as an implantation mask operative to protect masked portions of the layer 122 from the implanted species. Portions of the layer 122 that are not protected by the mask are implanted and become the IMO regions 122a. One skilled in the art will appreciate that a dielectric material such as silicon oxide (SiO$_X$), silicon nitride (SiN$_X$), or the like may be used to electrically isolate adjacent memory cells 600 from one another and to fill in open areas within the array 699.

Figure 7:
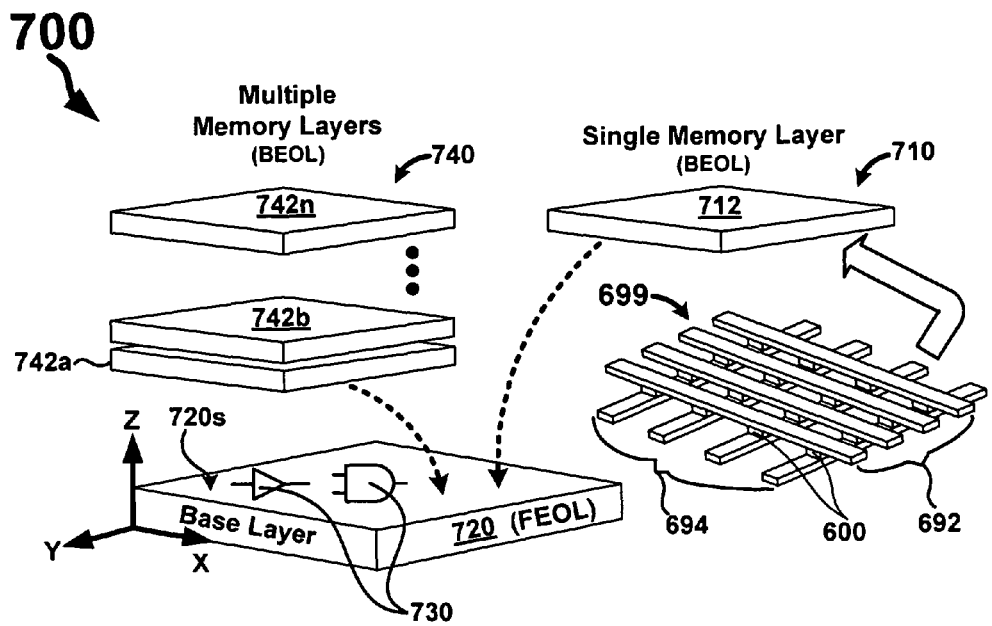
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 700 can include non-volatile and re-writable memory cells 600 disposed in a single layer 710 or in multiple layers 740 of memory, according to various embodiments of the invention.

In this example, integrated circuit 700 is shown to include either multiple layers 740 of memory (e.g., layers 742a, 742b, . . . 742n) or a single layer 710 of memory 712 formed on (e.g., fabricated above) a base layer 720 (e.g., a silicon wafer). In at least some embodiments, each layer of memory (712, or 742a, 742b, . . . 742n) can include the cross point array 699 having conductive array lines (692, 694) arranged in different directions (e.g., substantially orthogonal to one another) to access memory cells 600 (e.g., two-terminal memory cells). For example, conductors 692 can be X-direction array lines (e.g., row conductors) and conductors 694 can be Y-direction array lines (e.g., column conductors). Base layer 720 can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 730 is fabricated. The active circuitry 730 includes analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
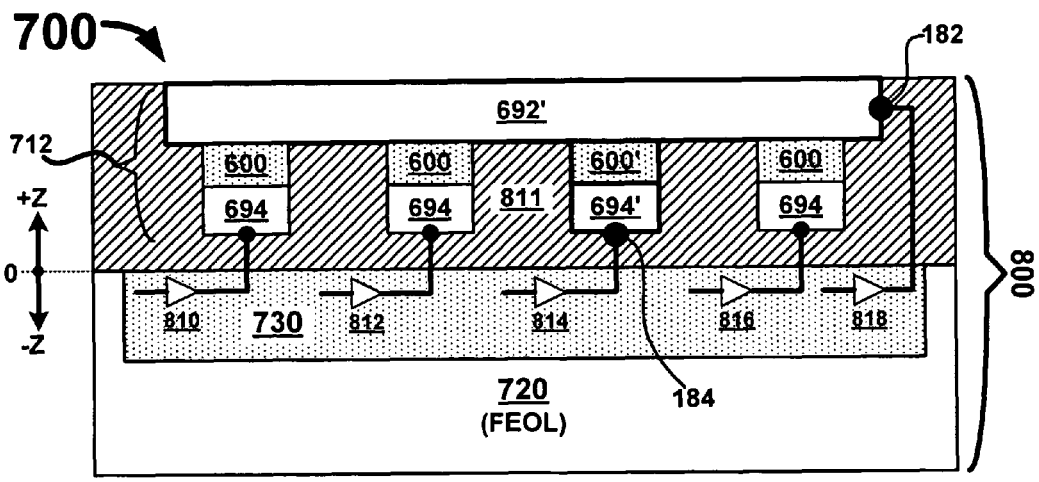
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 730 fabricated on the base layer 720. As one example, the base layer 720 can be a silicon (Si) wafer and the active circuitry 730 can be microelectronic devices formed on the base layer 720 using a CMOS fabrication process. The memory cells 600 and their respective conductive array lines (692, 694) can be fabricated on top of the active circuitry 730 in the base layer 720. Those skilled in the art will appreciate that an inter-level interconnect structure (not shown) can electrically couple the conductive array lines (692, 694) with the active circuitry 730 which may include several metal layers. For example, vias can be used to electrically couple the conductive array lines (692, 694) with the active circuitry 730. The active circuitry 730 may include but is not limited to address decoders, sense amps, memory controllers, data buffers, direct memory access (DMA) circuits, voltage sources for generating the read and write voltages, just to name a few. Active circuits 810-818 can be configured to apply the select voltage potentials (e.g., read and write voltage potentials) to selected conductive array lines (692', 694'). Moreover, the active circuitry 730 may be coupled with the conductive array lines (692', 694') to sense the read current $I_R$ from selected memory cells 600' during a read operation and the sensed current can be processed by the active circuitry 730 to determine the conductivity profiles (e.g., the resistive state) of the selected memory cells 600'. In some applications, it may be desirable to prevent un-selected array lines (692, 694) from floating. The active circuits 730 can be configured to apply an un-select voltage potential (e.g., approximately a ground potential) to the un-selected array lines (692, 694). A dielectric material 811 (e.g., $SiO_2$) may be used where necessary to provide electrical insulation between elements of the integrated circuit 700.

Figure 8B:
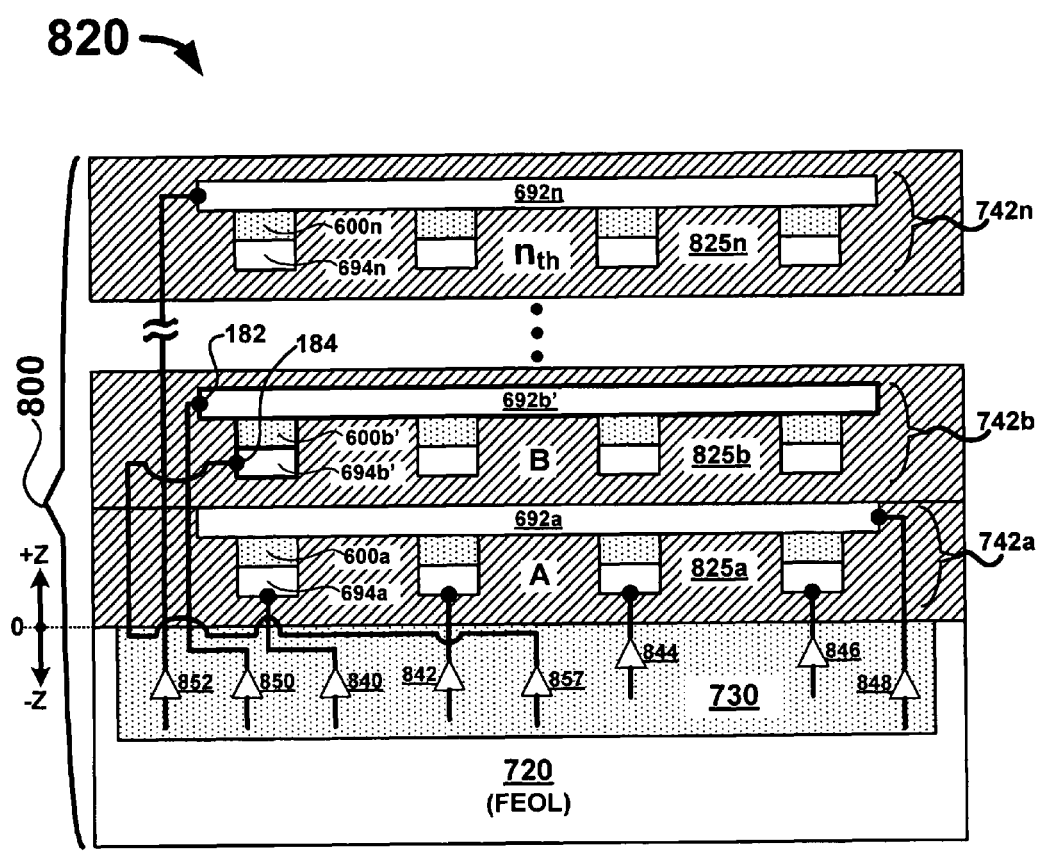
FIG. 8B depicts a cross-sectional view of an integrated circuit including vertically stacked layers of memory fabricated over a substrate including active circuitry fabricated in a logic layer.

Moving now to FIG. 8B, an integrated circuit 820 includes a plurality of non-volatile memory arrays that are vertically stacked above one another (e.g., along the Z-axis) and are positioned above the base layer 720 that includes the active circuitry 730. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 600a and first and second conductive array lines (692a, 694a), Layer B includes memory cells 600b and first and second conductive array lines (692b, 694b), and if the nth layer is implemented, then the nth layer includes memory cells 600n and first and second conductive array lines (692n, 694n). Dielectric materials 825a, 825b, and 825n (e.g., $SiO_2$) may be used where necessary to provide electrical insulation between the memory layers of the integrated circuit 820. Active circuits 840-857 can be configured to apply the select voltage potentials (e.g., read and write voltage potentials) to selected conductive array lines (e.g., 692a, b, . . . n, and 694a, b, . . . n). Driver circuits 850 and 857 are activated to select conductive array lines 692' and 694' to select memory cell 600b' for a data operation. As was described above, the active circuits 730 can be used to sense the read current $I_R$ from selected memory cells 600b' during a read operation and can be configured to apply the un-select voltage potential to the un-selected array lines.

Figure 8C:
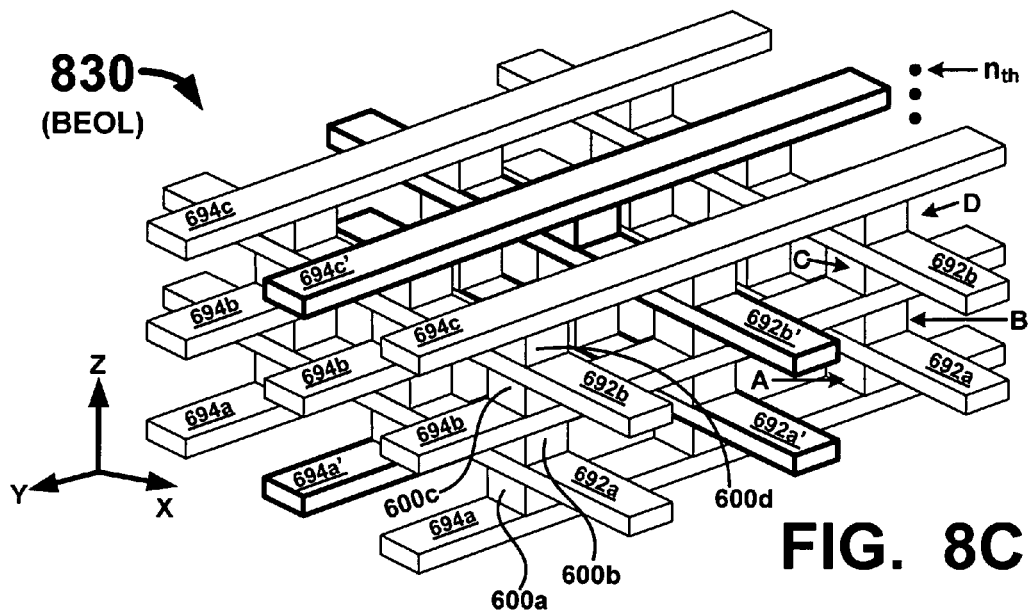
FIG. 8C depicts a vertically stacked layers of memory in which conductive array lines are shared by memory cells in adjacent layers.

Attention is now directed to FIG. 8C, where a vertically stacked array 830 includes a plurality of memory layers A,B, C, and D with each memory layer including memory cells 600a, 600b, 600c, and 600d. Although only four layers are depicted, the array 830 can include additional layers up to an nth layer. The array 830 includes two levels of x-direction conductive array lines 692a and 692b, and three levels of y-direction conductive array lines 694a, 694b, and 694c. In contrast to the integrated circuit 820 depicted in FIG. 8B where each array layer is electrically isolated from other layers by a dielectric material, each memory cell 600a, 600b, 600c, and 600d shares a conductive array line with other memory cells that are positioned above, below, or both above and below that memory cell. Conductive array lines 692a' and 694a' select a memory cell 600a' for a data operation, and conductive array lines 692b' and 694c' select a memory cell 600d' for a data operation (see FIG. 8D).

Figure 8D:
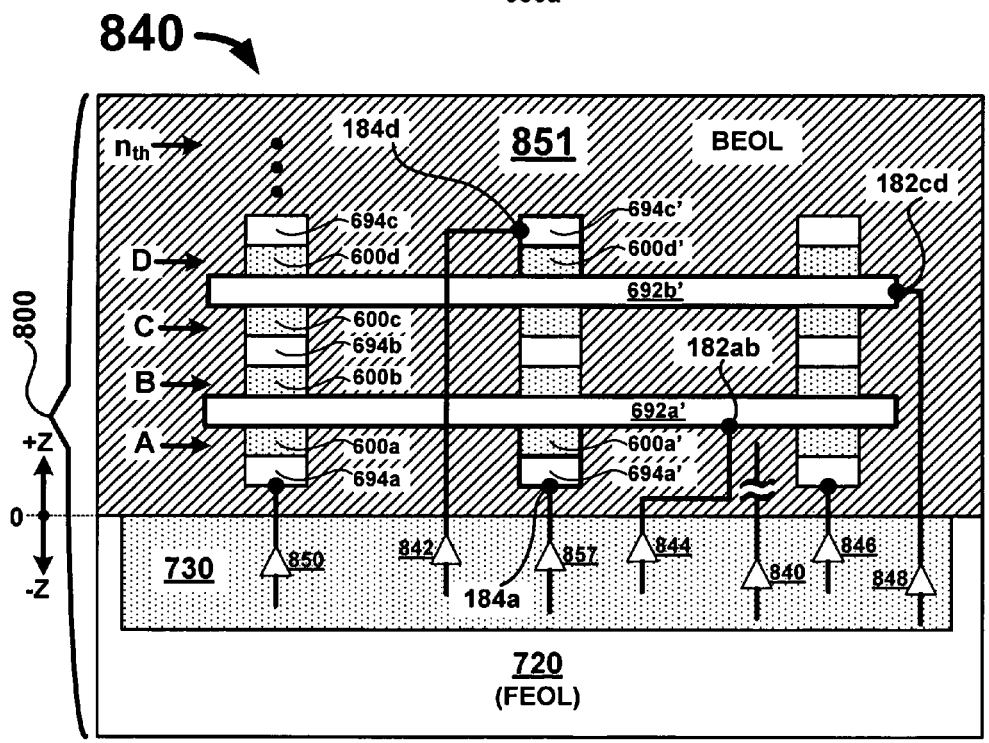
FIG. 8D depicts an integrated circuit including vertically stacked layers of memory with shared conductive array lines fabricated over a substrate including active circuitry fabricated in a logic layer.

In FIG. 8D, an integrated circuit 840 includes base layer 720, active circuitry 730, and vertically staked memory layers A, B, C, and D that are fabricated above the base layer 720. Active circuits 840-857 are configured to perform data operations on the vertically staked memory layers A, B, C, and D. Driver circuits 844 and 857 are activated to select memory cell 600a' for a data operation and driver circuits 842 and 848 are activated to select memory cell 600d' for a data operation. A dielectric layer 851 is operative to electrically isolate the various components of integrated circuit 840.

Figure 9:
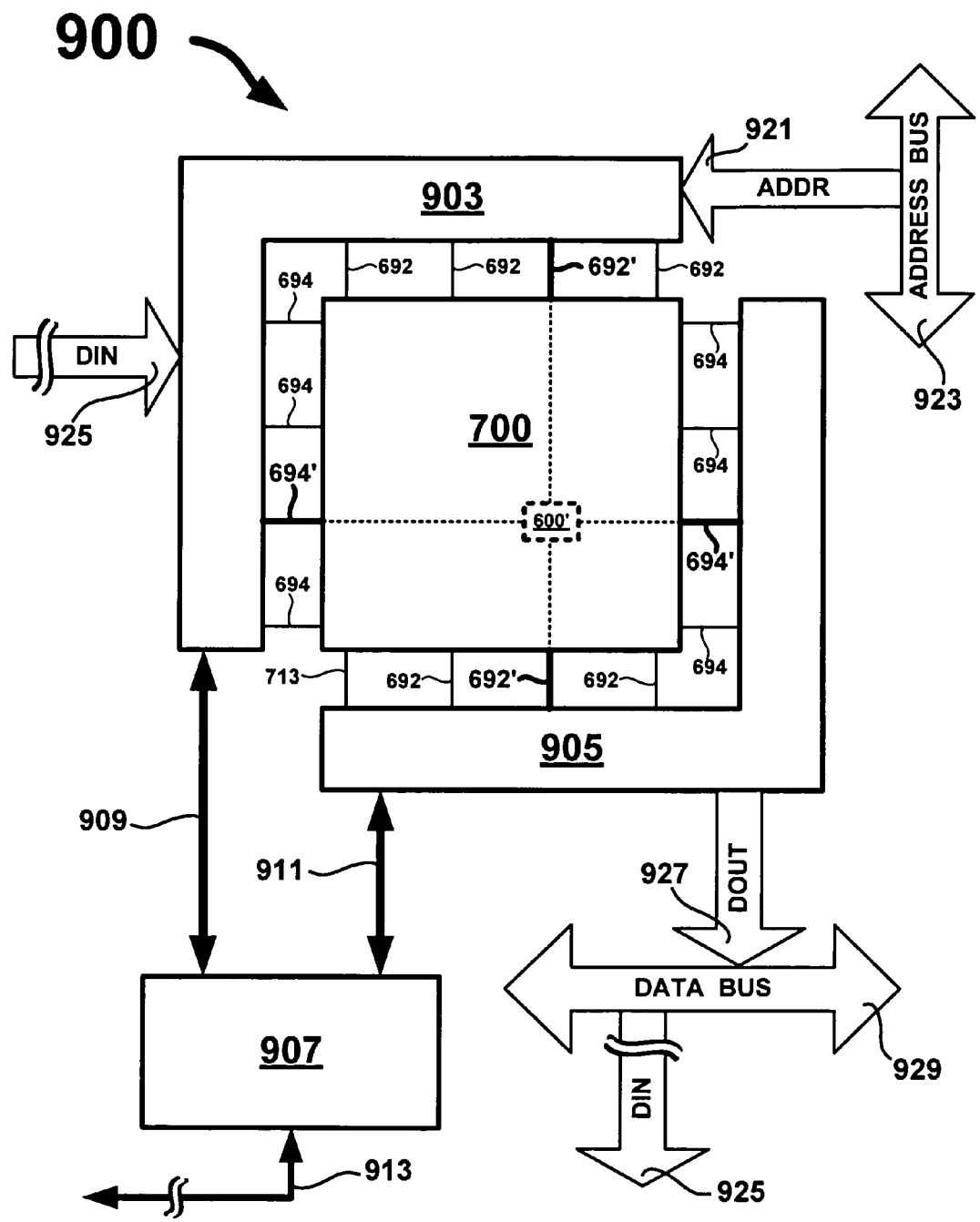
FIG. 9 depicts a memory system including a non-volatile two-terminal cross-point array.

Moving on to FIG. 9, an exemplary memory system 900 includes the aforementioned non-volatile two-terminal cross-point memory array 700 (array 700 hereinafter) and the plurality of first conductive and second conductive traces denoted as 692 and 694, respectively. The memory system 900 also includes an address unit 903 and a sense unit 905. The address unit 903 receives an address ADDR, decodes the address, and based on the address, selects at least one of the plurality of first conductive traces (denoted as 692') and one of the plurality of second conductive traces (denoted as 694'). The address unit 903 applies select voltage potentials (e.g., read or write voltages) to the selected first and second conductive traces 692' and 694'. The address unit 903 also applies a non-select voltage potential to unselected traces 692 and 694. The sense unit 905 senses one or more currents flowing through one or more of the conductive traces. During a read operation to the array 700, current sensed by the sense unit 905 is indicative of stored data in a memory cell 600' positioned at an intersection of the selected first and second conductive traces 692' and 694'. A bus 921 coupled with an address bus 923 can be used to communicate the address ADDR to the address unit 903. The sense unit 905 processes the one or more currents and at least one additional signal to generate a data signal DOUT that is indicative of the stored data in the memory plug. In some embodiments, the sense unit 905 may sense current flowing through a plurality of memory plugs and processes those currents along with additional signals to generate a data signal DOUT for each of the plurality of memory plugs. A bus 927 communicates the data signal DOUT to a data bus 929. During a write operation to the array 700, the address unit 903 receives write data DIN to be written to a memory plug specified by the address ADDR. A bus 925 communicates the write data DIN from the data bus 929 to the address unit 903. The address unit 903 determines a magnitude and polarity of the select voltage potentials to be applied to the selected first and second conductive traces 692' and 694' based on the value of the write data DIN. For example, one magnitude and polarity can be used to write a logic "0" and a second magnitude and polarity can be used to write a logic "1". In other embodiments, the memory system 900 can include dedicated circuitry that is separate from the address unit 903 to generate the select potentials and to determine the magnitude and polarity of the select potentials.

One skilled in the art will appreciate that the memory system 900 and its components (e.g., 903 and 905) can be electrically coupled with and controlled by an external system or device (e.g., a microprocessor or a memory controller). Optionally, the memory system 900 can include at least one control unit 907 operative to coordinate and control operation of the address and sense units 903 and 905 and any other circuitry necessary for data operations (e.g., read and write operations) to the array 700. One or more signal lines 909 and 911 can electrically couple the control unit 907 with the address and sense units 903 and 905. The control unit 907 can be electrically coupled with an external system (e.g., a microprocessor or a memory controller) through one or more signal lines 913.

As was described above in reference to FIGS. 7 through 8D, one or more of the arrays 700 can be positioned (e.g., fabricated BEOL) over a substrate 720 that includes active circuitry 730 and the active circuitry 730 can be electrically coupled with the array(s) 700 using an interconnect structure that couples signals from the active circuitry 730 with the conductive array lines 692 and 694. In FIG. 9, the busses, signal lines, control signals, the address, sense, and control units 903, 905, and 907 can comprise the active circuitry 730 and its related interconnect, and can be fabricated FEOL on the substrate 720 (e.g., a silicon wafer) using a microelectronics fabrication technology, such as CMOS, for example.

Figure 10:
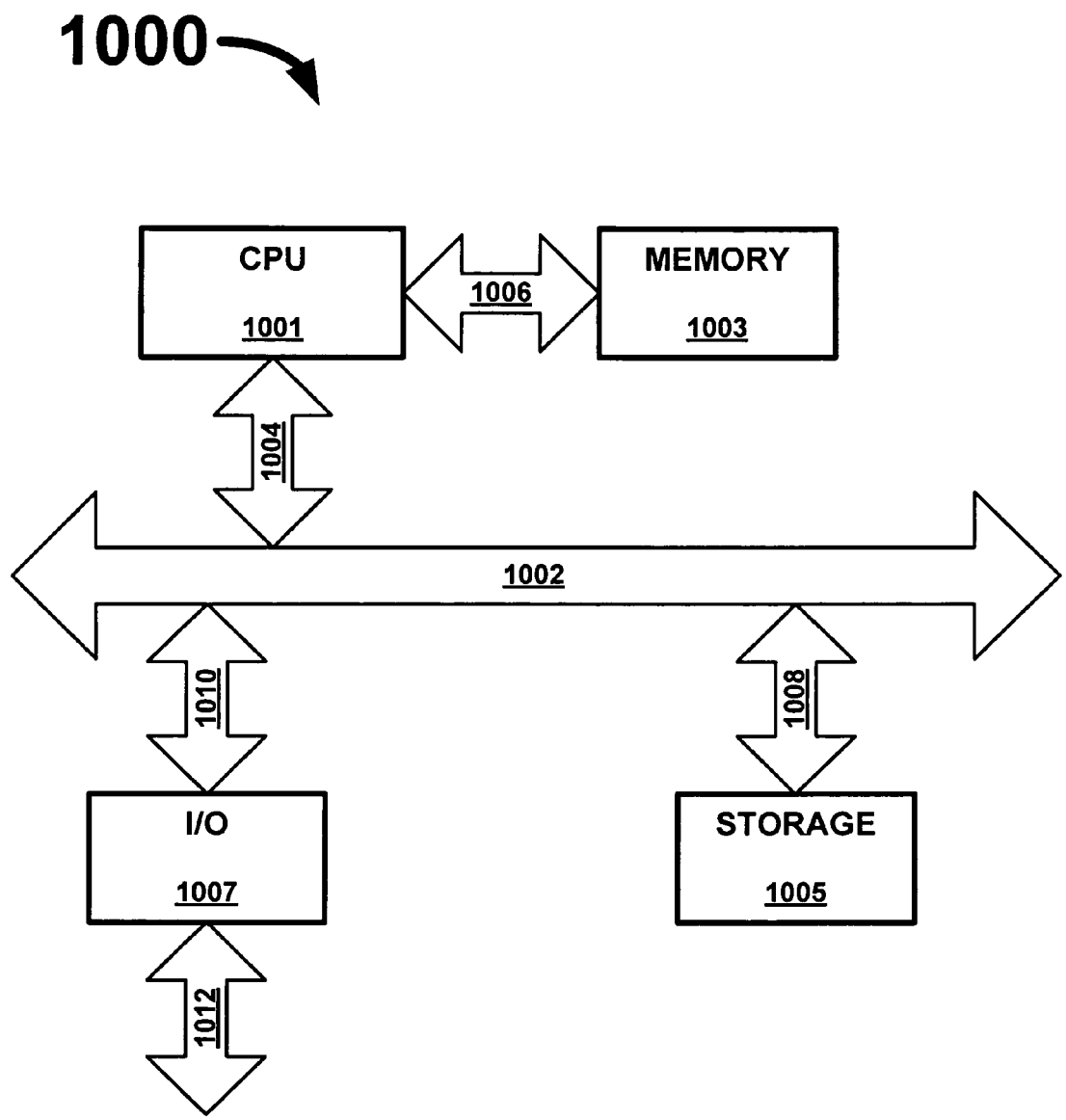
FIG. 10 depicts an exemplary electrical system that includes at least one non-volatile two-terminal cross-point array.

Reference is now made to FIG. 10, where an electrical system 1000 includes a CPU 1001 that is electrically coupled 1004 with a bus 1002, an I/O unit 1007 that is electrically coupled 1010 with the bus 1002, and a storage unit 1005 that is electrically coupled 1008 with the bus 1002. The I/O unit 1007 is electrically coupled 1012 to external sources (not shown) of input data and output data. The CPU 1001 can be any type of processing unit including but not limited to a microprocessor (μP), a micro-controller (μC), and a digital signal processor (DSP), for example. Via the bus 1002, the CPU 1001, and optionally the I/O unit 1007, performs data operations (e.g., reading and writing data) on the storage unit 1005. The storage unit 1005 stores at least a portion of the data in the aforementioned non-volatile two-terminal cross-point array as depicted in FIGS. 7 through 8D. Each memory array includes a plurality of the two-terminal memory cells 600. The configuration of the storage unit 1005 will be application specific. Example configurations include but are not limited to one or more single layer non-volatile two-terminal cross-point arrays (e.g., 712) and one or more vertically stacked non-volatile two-terminal cross-point arrays (e.g., 742a-742n). In the electrical system 1000, data stored in the storage unit 1005 is retained in the absence of electrical power. The CPU 1001 may include a memory controller (not shown) for controlling data operations to the storage unit 1005.

Alternatively, the electrical system 1000 may include the CPU 1001 and the I/O unit 1007 coupled with the bus 1002, and a memory unit 1003 that is directly coupled 1006 with the CPU 1001. The memory unit 1003 is configured to serve some or all of the memory needs of the CPU 1001. The CPU 1001, and optionally the I/O unit 1007, executes data operations (e.g., reading and writing data) to the non-volatile memory unit 1003. The memory unit 1003 stores at least a portion of the data in the aforementioned non-volatile two-terminal cross-point array as depicted in FIGS. 7A through 8D. Each memory array includes a plurality of the two-terminal memory elements 120. The configuration of the memory unit 1003 will be application specific. Example configurations include but are not limited to one or more single layer non-volatile two-terminal cross-point arrays (e.g., 712) and one or more vertically stacked non-volatile two-terminal cross-point arrays (e.g., 742a-742n). In the electrical system 1000, data stored in the memory unit 1003 is retained in the absence of electrical power. Data and program instructions for use by the CPU 1001 may be stored in the memory unit 1003. The CPU 1001 may include a memory controller (not shown) for controlling data operations to the non-volatile memory unit 1003. The memory controller may be configured for direct memory access (DMA).

Figure 11:
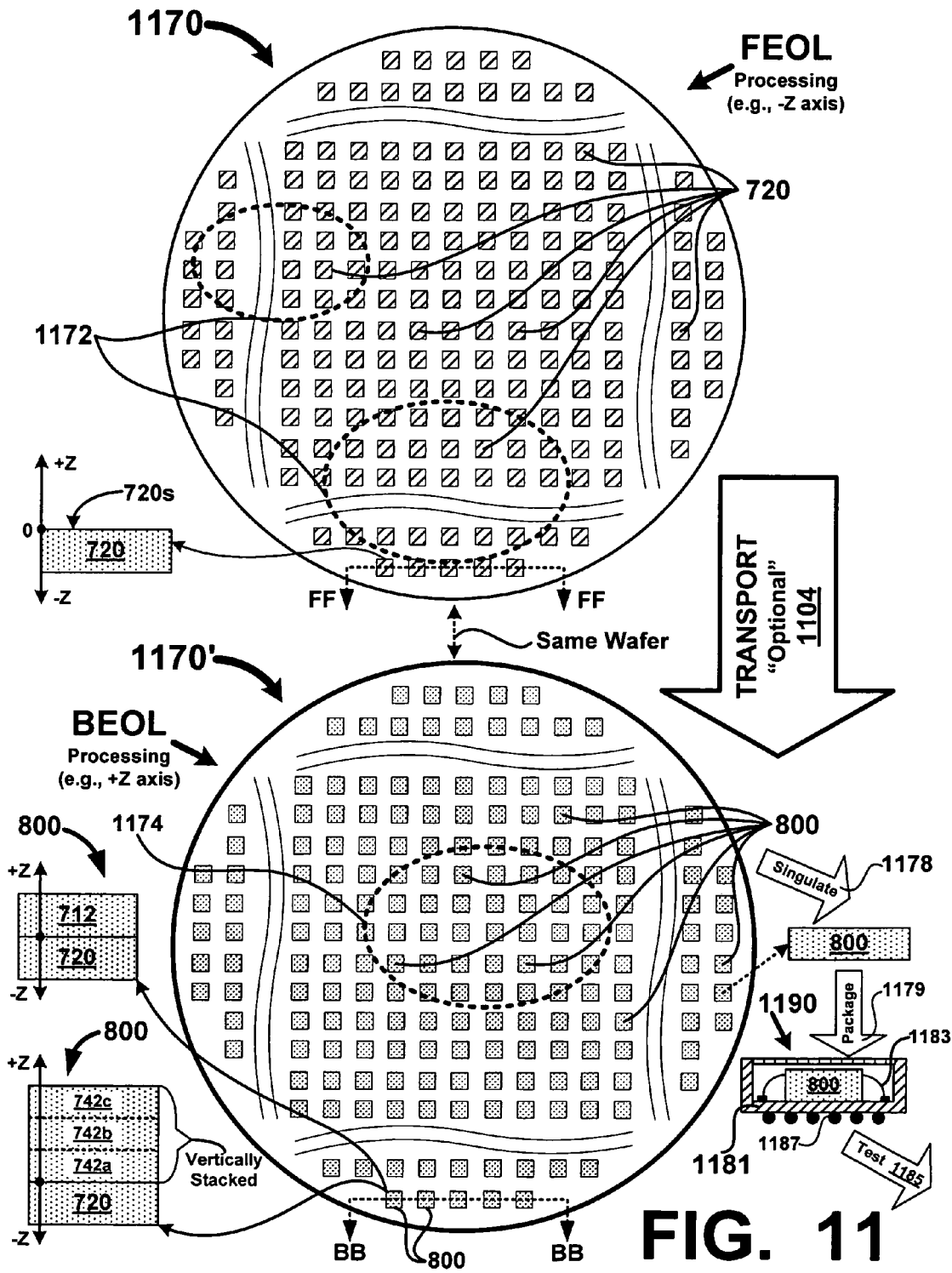
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742a, 742b, ... 742n) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720s of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 8D) that includes the FEOL circuitry portion 720 along the −Z axis and the BEOL memory portion along the +Z axis (see FIGS. 8A-8D). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742a, 742b, and 742c grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. One or more of the IC's 1190 can be used in a data storage system such as an embedded memory system (e.g., portable PC's, cell phones, PDA's, image capture devices, portable game players, MP3 players, video players, etc.), a RAID storage system in which the non-volatile memory in the one or more layers of memory in each IC 1190 is used to replace or supplant hard disc drives (HDD's) in the RAID system. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation is eliminated. Another application for the IC's 1190 is as a replacement for conventional FLASH-based non-volatile memory in solid state drives (SSD's). Here, one or more of the IC's 1190 can be mounted to a PC board along with other circuitry and placed in an appropriate enclosure to implement a SSD that can be used to replace a HDD. As mentioned above, the IC's 1190 do not require the erase before write operation and it associated latency and overhead. For both RAID and SSD applications, the vertically stacked memory arrays allow for increases in storage density without increasing die size because the memory arrays are fabricated above their associated active circuitry so extra memory capacity can be achieved by adding additional layers of memory above the FEOL base layer die 720.

In general, the devices and methods discussed herein are applicable to semiconductor memory. Examples of such memories include MRAM SRAM, and FLASH memory, cross-point array memory and stacked cross point array memory (e.g., whether single layer non-volatile two-terminal cross-point arrays, or one or more vertically stacked non-volatile two terminal cross arrays), three/third-dimension memory arrays (including those that emulate other types of memory, providing memory combinations within a single component), resistive state memory devices, and memory systems.

The various embodiments of the invention can be implemented in numerous ways, including as a system, a process, an apparatus, or a series of program instructions on a computer readable medium such as a computer readable storage medium or a computer network where the program instructions are sent over optical or electronic communication links.

In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A non-volatile memory device, comprising:
  a two-terminal memory element including
    a conductive oxide layer including mobile ions,
    an ion barrier layer that substantially stops the mobile ions from entering the ion barrier layer, and
    an electrolytic insulator layer having a thickness of less than 50 Å disposed in between and in contact with the conductive oxide layer and the ion barrier layer,
  the two-terminal memory element reversibly switchable from a first conductivity profile to a second conductivity profile upon application of a first write voltage across the two-terminal memory element and reversibly switchable from the second conductivity profile to the first conductivity profile upon application of a second write voltage across the two-terminal memory element, and
  wherein a conductivity profile of the two-terminal memory element is non-destructively determined by applying a read voltage across the two-terminal memory element.

2. A non-volatile memory device, comprising:
  a two-terminal memory element including
    a conductive oxide layer including mobile ions,
    an ion barrier layer that substantially stops the mobile ions from entering the ion barrier layer, and
    an electrolytic insulator layer having a thickness of less than 50 Å disposed in between and in contact with the conductive oxide layer and the ion barrier layer,
  the two-terminal memory element reversibly switchable from a first conductivity profile to a second conductivity profile upon application of a first write voltage across the two-terminal memory element and reversibly switchable from the second conductivity profile to the first conductivity profile upon application of a second write voltage across the two-terminal memory element; and
  wherein the conductive oxide layer comprises an electrically conductive perovskite material.

3. A non-volatile memory device, comprising:
  a two-terminal memory element including
    a conductive oxide layer including mobile ions,
    an ion barrier layer that substantially stops the mobile ions from entering the ion barrier layer, and
    an electrolytic insulator layer having a thickness of less than 50 Å disposed in between and in contact with the conductive oxide layer and the ion barrier layer,
  the two-terminal memory element reversibly switchable from a first conductivity profile to a second conductivity profile upon application of a first write voltage across the two-terminal memory element and reversibly switchable from the second conductivity profile to the first conductivity profile upon application of a second write voltage across the two-terminal memory element, and wherein the conductive oxide layer comprises an electrically conductive binary oxide material.

4. A non-volatile memory device, comprising:
a two-terminal memory element including
a conductive oxide layer including mobile ions,
an ion barrier layer that substantially stops the mobile ions from entering the ion barrier layer, and
an electrolytic insulator layer having a thickness of less than 50 Å disposed in between and in contact with the conductive oxide layer and the ion barrier layer,
the two-terminal memory element reversibly switchable from a first conductivity profile to a second conductivity profile upon application of a first write voltage across the two-terminal memory element and reversibly switchable from the second conductivity profile to the first conductivity profile upon application of a second write voltage across the two-terminal memory element, and
wherein the electrolytic insulator comprises a material selected from the group consisting of yttria-stabilized zirconia, zirconia, hafnium oxide, gadolinium oxide, and erbium oxide.

5. An electrical system, comprising:
a bus;
a processing unit in electrical communication with the bus;
an input/output (I/O) unit in electrical communication with the bus; and
a memory unit electrically coupled with the processing unit, the memory unit including
a substrate including active circuitry fabricated front-end-of-the-line (FEOL) on the substrate,
a plurality of first conductive array lines,
a plurality of second conductive array lines, and
a plurality of two-terminal memory cells, each two-terminal memory cell including a first terminal in electrical communication with only one of the plurality of first conductive array lines and a second terminal in electrical communication with only one of the plurality of second conductive array lines, the plurality of two-terminal memory cells and the plurality of first and second conductive array lines are fabricated back-end-of-the-line (BEOL) in one or more memory layers in contact with and positioned over the substrate with the plurality of first and second conductive array lines in electrical communication with at least a portion of the active circuitry, each two-terminal memory cell including a two-terminal memory element electrically in series with its respective first and second terminals, each two-terminal memory element including
a conductive oxide layer including mobile ions,
an ion barrier layer that substantially stops the mobile ions from entering the ion barrier layer, and
an electrolytic insulator layer having a thickness of less than 50 Å disposed in between and in contact with the conductive oxide layer and the ion barrier layer.

6. The electrical system of claim 5, wherein the one or more memory layers comprise stacked non-volatile two-terminal cross-point memory arrays in electrical communication with at least a portion of the active circuitry.

7. A two-terminal memory cell, comprising:
a conductive oxide layer including mobile ions;
an ion barrier layer; and
an electrolytic insulator having a thickness of not more than 100 Å and having a top surface, the electrolytic insulator disposed between and in contact with the conductive oxide layer and the ion barrier layer, the ion barrier layer disposed on the top surface of the electrolytic insulator, the ion barrier layer configured to prevent ions from leaving the top surface of the electrolytic insulator,
wherein the conductive oxide layer, the electrolytic insulator, and the ion barrier layer are electrically in series with one another, and
wherein the conductive oxide layer and the electrolytic insulator are configured to cooperatively facilitate ionic conduction so as to modify a conductivity of the electrically in series combination of the conductive oxide layer, the electrolytic insulator, and the ion barrier layer.

8. The two-terminal memory cell as set forth in claim 7, wherein the conductive oxide layer comprises an electrically conductive perovskite material.

9. The two-terminal memory cell as set forth in claim 7, wherein the conductive oxide layer comprises an electrically conductive binary oxide material.

10. The two-terminal memory cell as set forth in claim 7, wherein the ion barrier layer comprises a material selected from the group consisting of silicon oxide, aluminum oxide, magnesium oxide, and lanthanum aluminum oxide.

11. The two-terminal memory cell as set forth in claim 7, wherein the electrolytic insulator comprises a material selected from the group consisting of yttria-stabilized zirconia, zirconia, hafnium oxide, gadolinium oxide, and erbium oxide.

12. A non-volatile memory device, comprising:
a substrate including active circuitry fabricated front-end-of-the-line (FEOL) on the substrate;
a plurality of first conductive array lines;
a plurality of second conductive array lines; and
a plurality of two-terminal memory cells, each two-terminal memory cell including a first terminal in electrical communication with only one of the plurality of first conductive array lines and a second terminal in electrical communication with only one of the plurality of second conductive array lines, the plurality of two-terminal memory cells and the plurality of first and second conductive array lines are fabricated back-end-of-the-line (BEOL) in one or more memory layers in contact with and positioned over the substrate with the plurality of first and second conductive array lines in electrical communication with at least a portion of the active circuitry, each two-terminal memory cell including a two-terminal memory element electrically in series with its respective first and second terminals, each two-terminal memory element including
a conductive oxide layer including mobile ions,
an ion barrier layer that substantially stops the mobile ions from entering the ion barrier layer, and
an electrolytic insulator layer having a thickness of less than 50 Å disposed in between and in contact with the conductive oxide layer and the ion barrier layer.

13. The non-volatile memory device as set forth in claim 12, wherein the plurality of first conductive array lines have an orientation that is substantially orthogonal to the plurality of second conductive array lines and each two-terminal memory cell is positioned substantially at an intersection of one of the plurality of first conductive array lines with one of the plurality of second conductive array lines.

14. The non-volatile memory device as set forth in claim 12, wherein the ion barrier layer comprises a material selected from the group consisting of silicon oxide, aluminum oxide, magnesium oxide, and lanthanum aluminum oxide.

15. The non-volatile memory device as set forth in claim 12, wherein the conductive oxide layer comprises an electrically conductive perovskite material.

16. The non-volatile memory device as set forth in claim 12, wherein the conductive oxide layer comprises an electrically conductive binary oxide material.

17. The non-volatile memory device as set forth in claim 12, wherein the electrolytic insulator comprises a material selected from the group consisting of yttria-stabilized zirconia, zirconia, hafnium oxide, gadolinium oxide, and erbium oxide.

* * * * *